United States Patent [19]
Dai et al.

[11] Patent Number: 5,886,904
[45] Date of Patent: Mar. 23, 1999

[54] LATCH OPTIMIZATION IN HARDWARE LOGIC EMULATION SYSTEMS

[75] Inventors: Wei-Jin Dai, Cupertino; Junjing Yan, Mountain View, both of Calif.

[73] Assignee: Quickturn Design Systems, Inc., Mountain View, Calif.

[21] Appl. No.: 718,655

[22] Filed: Sep. 23, 1996

[51] Int. Cl.⁶ ............................. G06F 9/455; G06F 17/50
[52] U.S. Cl. .............................................................. 364/578
[58] Field of Search .................................. 364/488–491, 364/578; 395/500

[56] References Cited

U.S. PATENT DOCUMENTS

| | | | |
|---|---|---|---|
| 4,306,286 | 12/1981 | Cocke et al. . | |
| 4,656,580 | 4/1987 | Hitchcock, Sr. et al. . | |
| 4,899,273 | 2/1990 | Omoda et al. . | |
| 4,914,612 | 4/1990 | Beece et al. . | |
| 5,036,473 | 7/1991 | Butts et al. . | |
| 5,109,353 | 4/1992 | Sample et al. . | |
| 5,329,470 | 7/1994 | Sample et al. . | |
| 5,352,123 | 10/1994 | Sample et al. | 439/61 |
| 5,359,535 | 10/1994 | Djaja et al. | 364/489 |
| 5,425,036 | 6/1995 | Liu et al. | 371/24 |
| 5,448,496 | 9/1995 | Butts et al. | 364/489 |
| 5,452,231 | 9/1995 | Butts et al. | 364/488 |
| 5,452,239 | 9/1995 | Dai et al. | 364/578 |
| 5,475,830 | 12/1995 | Chen | 395/500 |
| 5,477,475 | 12/1995 | Sample et al. | 364/578 |
| 5,521,529 | 5/1996 | Agrawal et al. | 326/41 |
| 5,551,013 | 8/1996 | Beausoleil et al. | 395/500 |
| 5,612,891 | 3/1997 | Butts et al. . | |

OTHER PUBLICATIONS

UK Search Report, Feb. 27, 1998.
M.Mladejovsky, "Hierarchial–Level CAE system features snap and simplicity"; Dialog Record 01204382 of Electronic Design, v. 35, 19 Feb. 1987, pp. 113–114.
Pfister, "The Yorktown Simulation Engine: Introduction," 19th Design Automation conference, P. 7.1 1982 pp. 51–54.
Denneau, "The Yorktown Simulation Engine," 19th Design Automation conference, p. 7.2 1982, pp. 55–592.

*Primary Examiner*—Kevin J. Teska
*Assistant Examiner*—Ayni Mohamed
*Attorney, Agent, or Firm*—Lyon & Lyon LLP

[57] ABSTRACT

A method for optimizing a logical design for emulation. The present invention optimzes latch-based designs by transforming them into a flip-flop based circuit. The design is analyzed to determine whether any consecutive latches are clocked by the same clock signal. If consecutive latches are clocked by the same clock signal, for example, the same phase of the same master clock, a transparency condition exists. Transparent latches are transformed into either a flip-flop/buffer/multiplexer circuit or a buffer circuit depending upon whether the latch in the logic design has an enable input. If consecutive latches in a design are clocked by different clock signals, i.e., different phases of the master clock, no transparency condition exists. Non-transparent latches are transformed into a flip-flop.

16 Claims, 13 Drawing Sheets

LATCH OPTIMIZATION IN HARDWARE LOGIC EMULATION SYSTEMS

1. FIELD OF THE INVENTION

This invention pertains to hardware logic emulation and more specifically to optimizing latch based designs for logic emulation.

2. BACKGROUND OF THE INVENTION

Hardware logic emulators are a powerful tool used during the design of integrated circuits such as application specific integrated circuits (known to those skilled in the art as "ASICs") and microprocessors. Hardware emulation systems allow a circuit designer to implement a logical equivalent of their design in hardware prior to implementing the design as an integrated circuit. This allows the user to determine whether their design performs as expected. It also allows for the co-design of related components such as software. Hardware emulators also allow users to verify that the circuit they have designed will function in the system in which the integrated circuit will eventually reside (i.e., the "target system"). Prior art emulators utilized reprogrammable logic integrated circuits that were interconnected together with programmable interconnect resources. For examples of such emulators, see U.S. Pat. Nos. 5,109,353, 5,036,473, 5,452,239, and, 5,475,830, all of which are assigned to the same assignee as the present invention and all of which are incorporated herein by reference.

Hardware logic emulation systems can also be constructed with many microprocessors interconnected in a massively parallel configuration. For an example of such an arrangement, see U.S. Pat. Nos. 4,306,286, 4,656,580, 4,914,612, and 5,551,013, all of which are incorporated herein by reference. In such an arrangement, the signals between each processor are time multiplexed. Thus, for each clock cycle, connections between the processors are established so that the processor resources necessary to evaluate the logical operations occurring during that clock cycle are interconnected. After the logic operations for that clock cycle are evaluated, the emulator reconfigures the interconnect between the processors so that the necessary processor resources are interconnected to evaluate the logical operations during the next clock cycle. U.S. Pat. No. 5,551,013, in particular, describes a preferred structure for implementation of the present invention.

Recently, latch-based designs have become common among integrated circuit designers because they can be implemented using smaller integrated circuit layout geometries than can other sequential logic functions such as flip-flops. However, while latch-based designs offer advantages when implemented on the integrated circuit, latches are difficult to implement in a processor-based emulation system. To understand why latches are difficult to implement in this environment, a brief discussion of flip-flops and latches will be provided. This discussion will refer to FIGS. 1–4. As is known to those of ordinary skill in the art, flip-flops are edge triggered sequential devices. Thus, upon the arrival of a clock ("CLK") edge, as shown in FIG. 2, the output ("Q") will take the value of the input ("D"). The flip-flop 10 shown in FIGS. 1–2 is a positive edge triggered flip-flop. In contrast to flip-flops, as is also known to those of ordinary skill in the art, latches are level sensitive sequential devices. Thus, in a latch, the output ("Q") follows the input ("D") when the clock ("CLK") goes high. The output ("Q") then holds that value when the clock ("CLK") goes low. The latch 20 shown in FIGS. 3–4 is a positive transparent latch.

A basic block diagram of the logic element of a presently preferred emulation processor is shown in FIG. 5a. The processors in a processor-based emulation system comprise an input stack 50, a logic table stack 60, and an output stack 70, as shown in FIG. 5a. The input stack 50 contains the input data signals that will comprise the inputs signals to the logic for a particular clock cycle. The output stack 70 comprises the output signals from the logic evaluated during a particular clock cycle. The logic table stack 60 comprises the possible primitives that can be evaluated by the processor. Thus, for a given clock cycle, the input signals of the input stack are evaluated using the logic primitives of the logic table stack. The result of the evaluation is placed in the output stack.

In a typical integrated circuit design, a clock generation circuit 100 generates one or more clock signals from the clock signal which will be input to the integrated circuit design. A block diagram for a clock generation circuit 100 is shown in FIG. 5b. Clock generation circuit 100 takes the input clock signal FCLK (which can come from the target system) and generates one or more clock signals A and B. Clock signals A and B are synchronous clock signals. The clock generation circuit can further generate non-overlapping phases of clock A (signal Aph_1 and Aph_2) and clock B (signals Bph_1 and Bph_2). Clock signals that are non-overlapping never go high at the same time. In general, design engineers utilize non-overlapping clocks when designing multi-latch logic circuits. The reason for this is that when design engineers utilize overlapping clock signals in these circuit designs, it becomes difficult to control signal propagation through the latches in the user's design. This can lead to race conditions and unpredictable circuit behavior, both of which are undesirable.

The manner in which processor-based emulators operate are such that flip-flop based designs emulate properly. As discussed, processor-based emulation systems are cycle based. Thus, for a given datapath, the processor in which the particular evaluation is taking place levelizes the combinational logic, i.e., the processor orders the levels of combinational logic to ensure that the proper input signals to each level are present when that level of logic is evaluated. For each emulation cycle, the processor only evaluates the combinational logic between the sequential logic gates. In the case of a datapath containing flip-flops, such an arrangement results in functionally correct emulation because flip-flops are edge-sensitive. Therefore, the output of the flip-flop can only change state when an edge of the clock occurs. Thus, in a processor-based emulation system, for each clock cycle, the flip-flop only transfers the data signal from one datapath to the next. Thus, the flip-flops are inherently part of the datapath in a processor-based emulation system.

Latches, unlike flip-flops, are not inherently part of the design because of the transparent nature of a latch. As discussed, latches are level sensitive devices where the state of the output does not change until the clock signal it receives approaches the level that the latch is sensitive to. Because of this characteristic of latches, latches can be transparent. Transparency of a latch-based circuit path occurs when a series of latches in a particular circuit path are all clocked by the same clock phase. If a series of latches are clocked at the same time, the output signals of each of the datapaths pass right through the latches, i.e., the latches are transparent. When the possibility of transparency is present, the processor-based emulator will be unable to determine where the datapaths ends. This characteristic renders emulation of latch-based circuit designs problematic. Thus, in a processor based emulation system like that described in U.S. Pat. No. 5,551,013, emulation of latch-based designs can be unsatisfactory.

Just as in a flip-flop based design, a circuit path of a typical latch-based design contains a datapath comprised of combinational logic feeding the inputs to the latches. An example of such a circuit path 200 is shown in FIG. 6. The circuit path 200 of FIG. 6 is comprised of latch 210, the output Q of which feeds datapath 215. Datapath 215 feeds the input D of latch 220. The output Q of latch 220 feeds datapath 225, which feeds the input D of latch 230. The emulator wants to evaluate what the circuit 200 does to a data signal at the input D of latch 210 for one emulation cycle. This means the emulator evaluates the signal path from one sequential logic element to the next sequential element. However, if each of latches 210, 220 and 230 are clocked by the same clock signal (or the same phase of the same clock signal), when each of the latches 210, 220, 230 receive a clock edge, the latches will all be transparent at the same time. Because of this, the latches 210, 220, 230 will pass the signal on their inputs D directly to their outputs Q, i.e., the latches will be transparent. This transparency makes the emulator unable to evaluate what the circuit 200 did to the data signal through a single emulation cycle. For example, if latches 210 and 230 are clocked by the same clock signal (or the same phase of the same clock signal phi), and latch 220 is clocked by a different, non-overlapping clock signal (or a different phase of the same clock signal ph2), the latches are not transparent to each other. On the other hand, if latch 210 and latch 220 are clocked by the same clock signal (or the same phase of the same clock signal), and latch 230 is clocked by a different, non-overlapping clock signal (or a different, non-overlapping phase, of the same clock signal), latch 210 is transparent to latch 220. Latch 220, however, is not transparent to latch 230. The reason for this is that the input D to latch 220 depends on the output Q of the latch (not shown) preceding latch 210 because latch 220 is clocked by the same clock signal as latch 210 (latch 210 is transparent). In contrast, the value of the input D to latch 230 depends upon the output Q of latch 220 because latches 220 and 230 are clocked by different clock signals (i.e., latch 220 is not transparent).

In contrast, flip-flops cannot be transparent. Because of this, flip-flops become inherent in a cycle based emulation environment, i.e., the output of datapath 215 and datapath 225 will be stored in flip-flops 220 and 230 respectfully. This property of flip-flops makes them ideal for this type of emulation environment. On the other hand, the transparency of latches makes them difficult to emulate. While it is possible to just substitute flip-flops for the latches in the user's design and over-sampling the signal that is input to the flip-flops to obtain the desired transparency effect, such a method results in significantly slower emulation speeds. Reduced emulation speed is highly undesirable. Thus a method of optimizing latch-based design for emulation in a processor-based emulation system is needed.

SUMMARY OF THE INVENTION

The present invention overcomes the problems and disadvantages of the prior art through a unique method of optimizing a user's logic design. The methods of the present invention operate by analyzing a user's design to determine whether it incorporates latches. If the design incorporates latches, the embodiments of the present invention then determine which of the latches in the user's design must be transparent, i.e., the present invention determines which latches of the user's design are transparent latches. Consecutive latches that are clocked by the same phase of the same clock signal (or the same clock signal), are transparent. For those latches in a user's design which are not transparent, the present invention transforms the latch in the user's design to a flip-flop. If the latch in the user's design is transparent, the present invention must take the transparency of the latch into account when performing the optimization. If the transparent latch does not have a clock enable input, it is transformed to an unclocked buffer. If the transparent latch has an enable input, it is transformed into a logic circuit whose input from the datapath feeding the latch is placed on both the input D of the flip and the input to an unclocked buffer. The output Q of the flip-flop is provided to the first data input of two-to-one multiplexer while the output from the unclocked buffer is provided to the second data input of the two-to-one multiplexer. The select input of the two-to-one multiplexer is provided by the enable signal which was the original input the transparent latch. This same signal is also input to the enable input of the flip-flop.

The present invention, if necessary, can convert designs from multi clock (multiple, multi-nononverlapping phase clocks) to a single clock design. As discussed, this step is not necessary if the emulation processors can handle more than one clock signal. Specifically, the present invention adds logic gates, which in a preferred embodiment are AND gates, to the inputs of the clock enable inputs of the flip-flops. The logic gates have as a first input the enable signal that formed the input to the latch of the user's design. A second input to the logic gate is the clock signal that formed the clock input to the unoptimized latch. This clock signal is inverted prior to being input to the logic gate.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Turning to the figures, the presently preferred method of the present invention will now be described.

The present invention operates by performing transformations in the user's logic design prior to emulation. Prior to emulating the design, a logic emulation system using the concepts of the present invention will evaluate the design, and optimize it for emulation using transformed logic. The optimized circuit allows the present invention to emulate a logical equivalent of the design, thus preserving the functions of emulation, one of which is the functional verification of the design. Thus, the transformations optimize the design for emulation.

The transformations that the present invention makes in the logic design undergoing emulation are as follows. The present invention transforms latch-based designs that have multiple, multi-nononverlapping phase clocks to a flip-flop-based design. If desired, the present invention can transform the user's design to a single clock design. The present invention analyses the design, and for each latch, determines what type of transformation is required to maintain logical equivalency. Presently preferred emulation processors only have the capability of handling a single clock signal. Thus, the present invention optimizes the clock path by converting the circuit to a single clock system which utilizes the master clock of the emulation processor. If emulation processors are used that have multi-clock capabilities, converting the circuit to a single clock system is not necessary.

Figure 1:
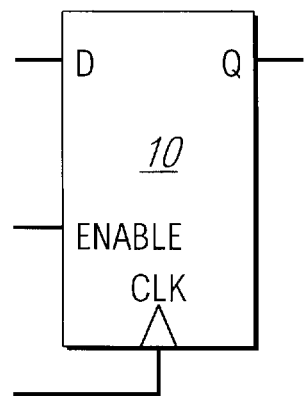
FIG. 1 is a schematic drawing of a flip-flop logic element.
Figure 2:
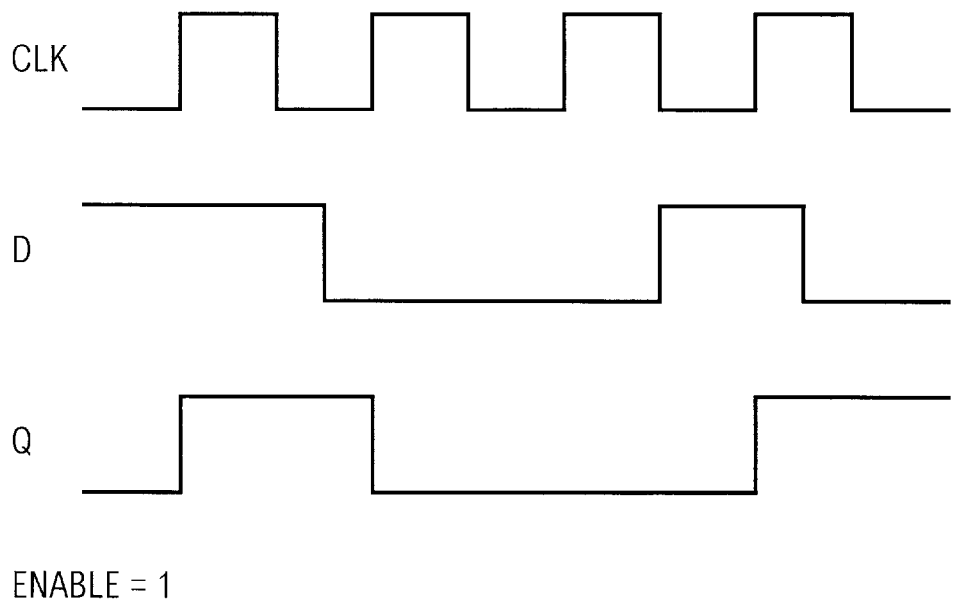
FIG. 2 is a graph of the signal traces for an exemplary clock signal, input signal and output signal for the flip-flop of FIG. 1.
Figure 3:
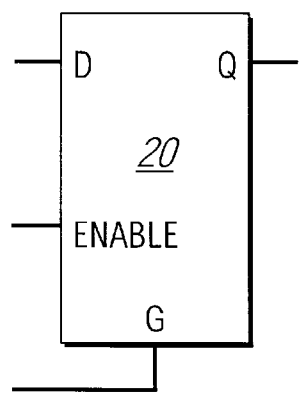
FIG. 3 is a schematic drawing of a latch logic element.
Figure 4:
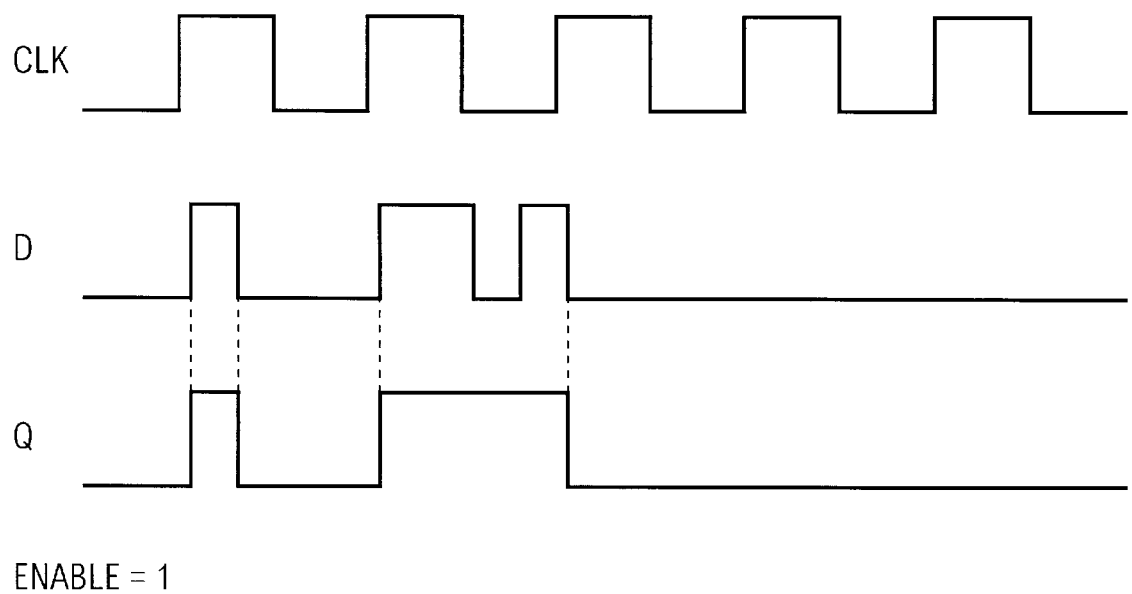
FIG. 4 is a graph of the signal traces for an exemplary clock signal, input signal and output signal for the latch of FIG. 3.
Figure 5A:
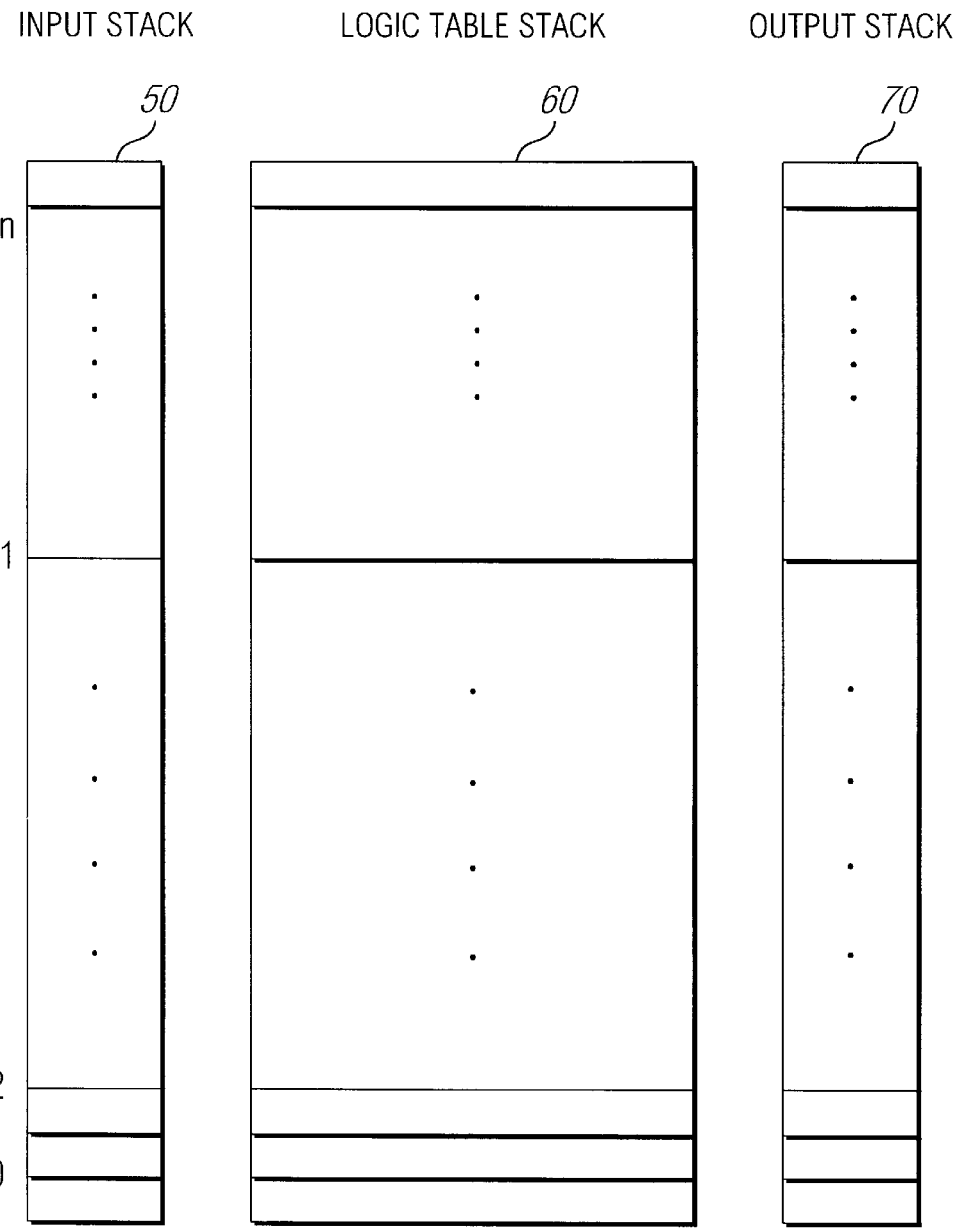
FIG. 5a is a basic block diagram of the architecture of a logic element of a preferred emulation processor for use in a processor-based emulation system.
Figure 5B:
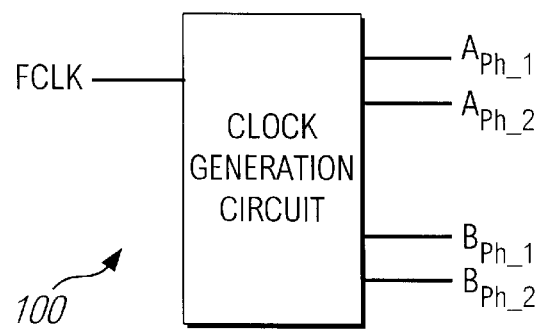
FIG. 5b is a block diagram of a clock generation circuit.
Figure 6:
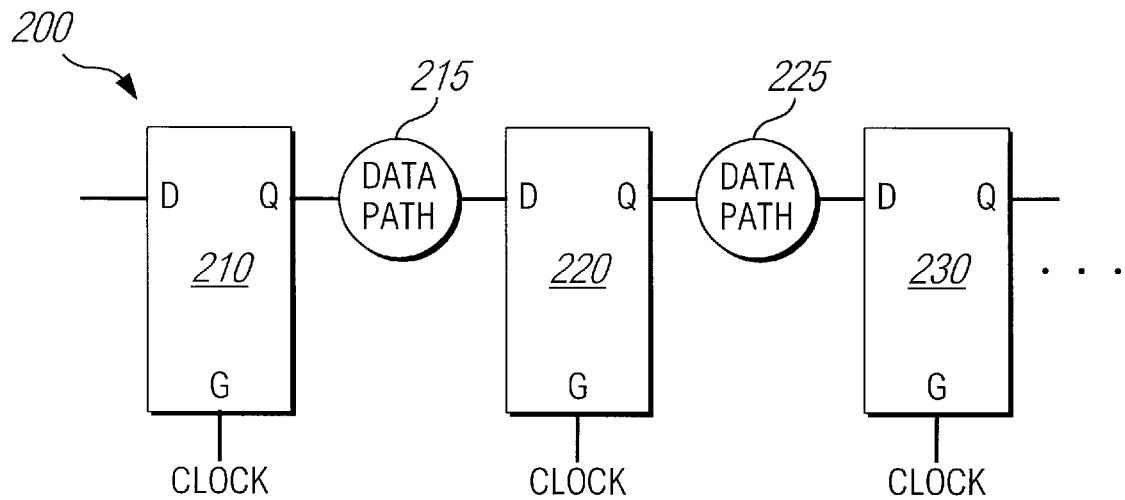
FIG. 6 is a schematic diagram of a latch-based logic circuit prior to being optimized by the methods of the present invention.
Figure 7:
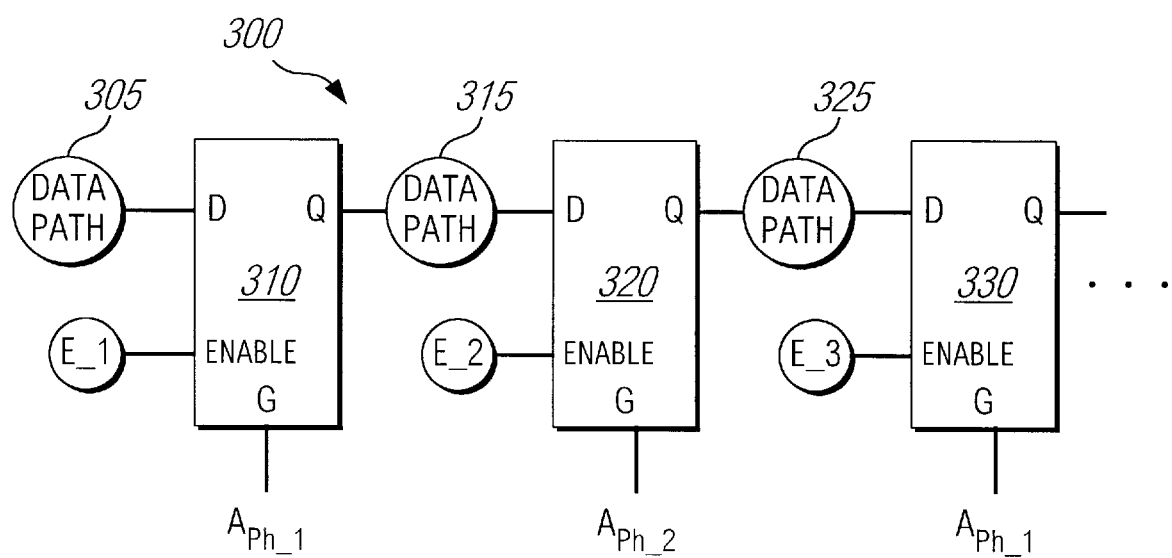
FIG. 7 is a schematic diagram of a latch-based logic circuit having consecutive latches that are clocked by different phases of the same clock signal.

For latches that are in consecutive stages clocked by different phases of the clock, i.e., phase 1 (Aph_1) and phase 2 (Aph_2), the latches are non-transparent. Such a circuit is shown in FIG. 7. The circuit path 300 of FIG. 7, is comprised of latch 310, the output Q of which feeds datapath 315. The input to latch 310 comes from datapath 305. Datapath 315 feeds the input D of latch 320. The output Q of latch 320 feeds datapath 325, which feeds the input D of latch 330. The enable input of latches 310, 320 and 330 are supplied with signals E_1, E_2 and E_3, respectively. Latch 310 is clocked by clock signal Aph_1; latch 320 is clocked by clock signal Aph_2; and latch 330 is clocked by clock signal Aph_1. Clock signals Aph_1 and Aph_2 are different phases of the same master clock signal FCLK, as seen in FIG. 5.

Figure 8:
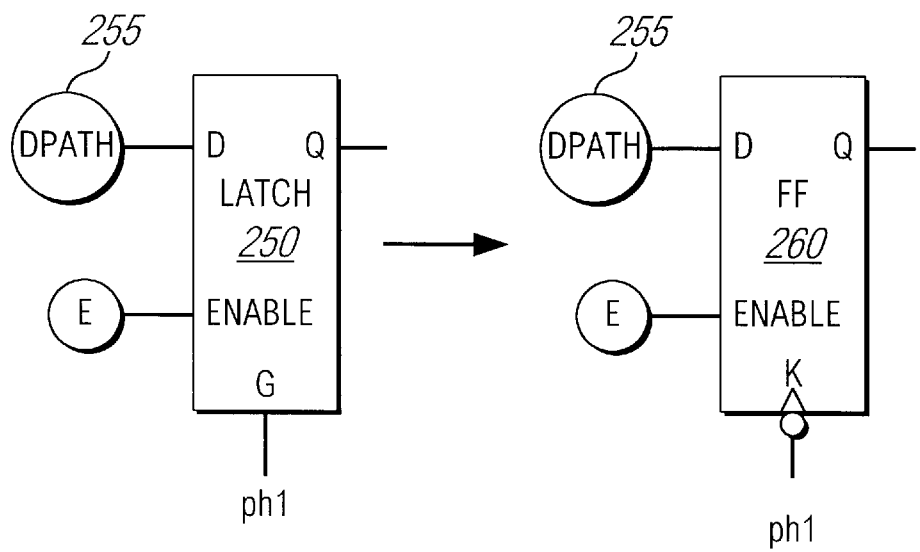
FIG. 8 is a diagram showing an optimization using the methods of the present invention.
Figure 8A:
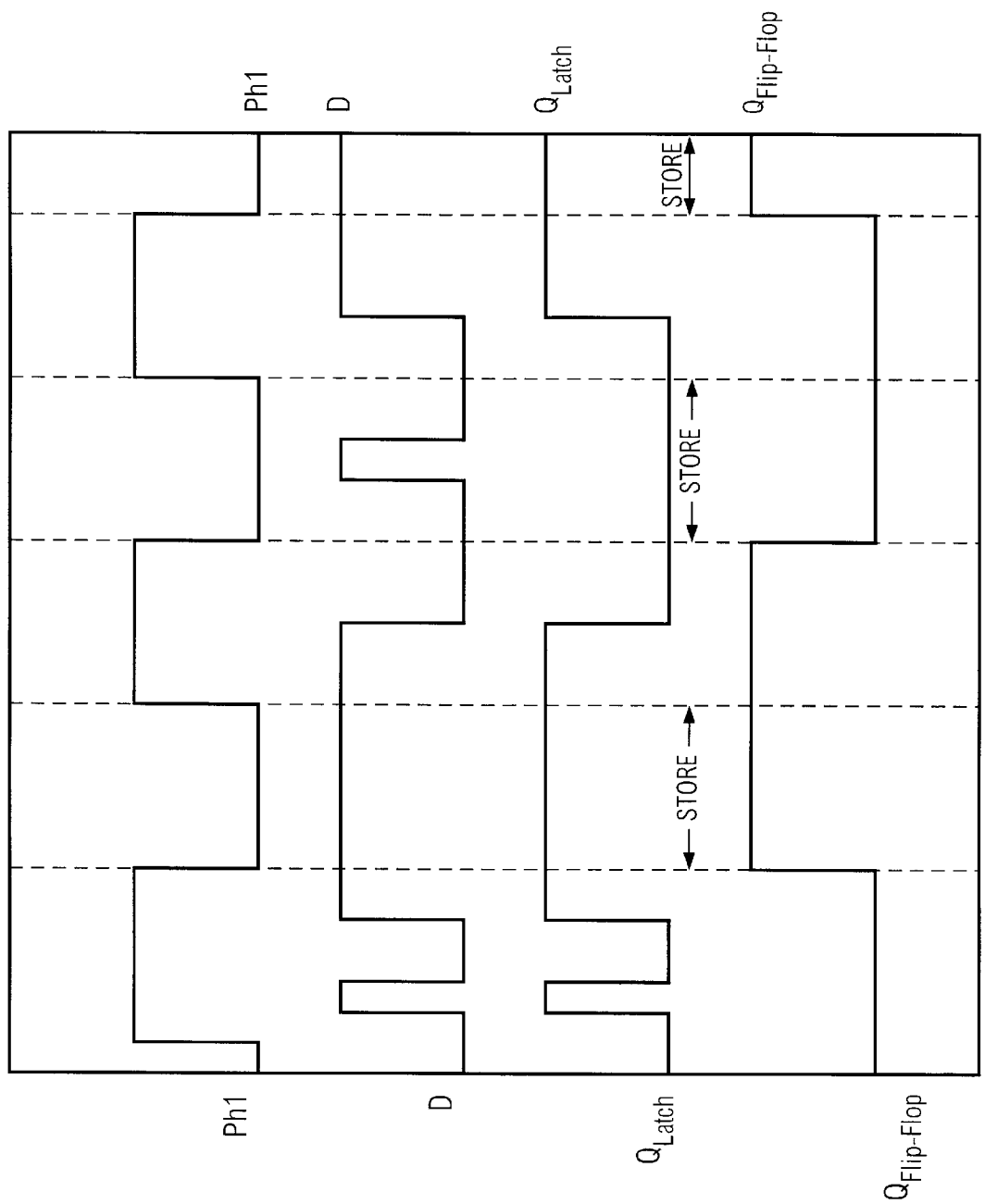
FIG. 8a shows signal traces of a positive transparency latch and a negative edge triggered flip-flop.

Because none of the successive latches are clocked by the same phase of the master clock signal FCLK, a transparency condition does not exist. Therefore, using the concepts of the present invention, the latch can be transformed by a flip-flop. This basic optimization is seen in FIG. 8. The latch 250 of FIG. 8 has as its input D the output of a datapath 255. Latch 250 has a signal E input to its enable input and is clocked by signal ph1. Because there is no transparency, latch 250 can be transformed into flip-flop 260. Flip-flop 260 has as its input D the output of the same datapath 255 that fed the latch 250. Flip-flop 250 has the same signal E input to its enable input. The clock input to flip-flop 260 is the inverted clock signal ph1. FIG. 8a shows signal traces which explain why the clock input to flip-flop 260 is the inverted clock signal ph1. Specifically, a latch needs to memorize the input value (D) at the time when the clock signal ph1 is low. A negative edge flip-flop (i.e., flip-flop with the clock input signal inverted), will memorize the input signal D when the clock signal ph1 is low.

Figure 9:
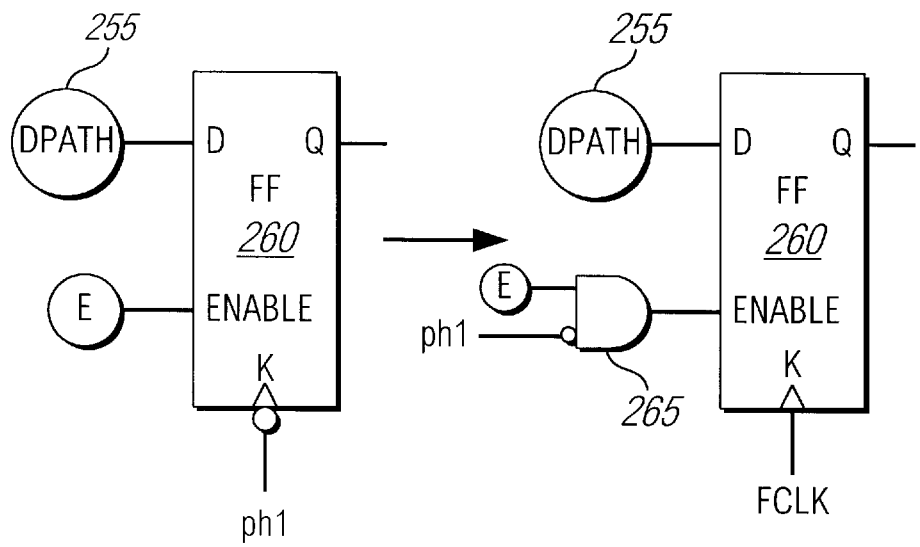
FIG. 9 is a diagram showing an additional optimization using the methods of the present invention.

After the latch 250 is transformed into flip-flop 260, the flip-flop can be transformed into a single clock system which utilizes the system's master clock. This transformation is shown in FIG. 9. As shown in FIG. 9, the present invention adds logic gate 265 and places the output of logic gate 265 onto the enable input of the flip-flop 260. In a preferred embodiment, logic gate 265 is an AND gate. Logic gate 265 has the enable signal E that formed the enable input E to latch 250 as its first input. The second input to logic gate 265 is the inverted clock phase signal ph1. The target system's master clock FCLK is then placed on the clock input of flip-flop 260.

Figure 10:
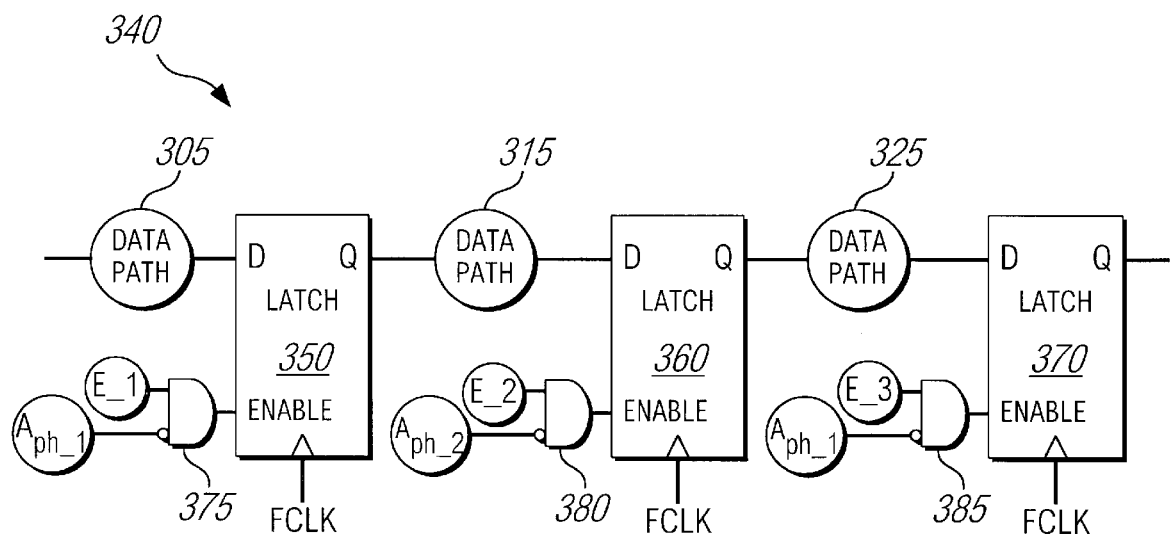
FIG. 10 is a schematic diagram of the logic circuit of FIG. 8 after being optimized using the methods of the present invention.

The optimized circuit 340 of the original latch-based design of FIG. 7 is shown in FIG. 10. As seen in FIG. 10, the present invention has transformed the latches 310, 320 and 330 into flip-flops 350, 360 and 370, respectfully. Datapath 305, datapath 315 and datapath 325 remain the same. In addition, in the manner described above, the present invention has added logic to the enable inputs of the flip-flops 350, 360 and 370 to convert the design to a single clock design. As discussed, this step is necessary if the emulation processors can handle more than one clock signal. Specifically, the present invention has added logic gates 375, 380 and 385. In a preferred embodiment shown in FIG. 10, logic gates 375, 380 and 385 are AND gates. The output of logic gate 375 feeds the enable input of flip-flop 350, the output of logic gate 380 feeds the enable input of flip-flop 360, and the output of logic gate 385 feeds the input of flip-flop 370. Logic gates 375, 380 and 390 have as a first input the enable signals that formed the inputs to the latches 310, 320 and 330 of the unoptimized circuit 300. Thus, logic gate 375 has the enable signal E_1 as its first input, logic gate 380 has the enable signal E_2 as its first input, and logic gate 385 has the enable signal E_3 as its first input. Logic gates 375, 380 and 390 have as a second input the inverted clock phase signal. Thus, logic gate 375 has the inverted clock signal Aph_1 as its second input, logic gate 380 has the inverted clock signal Aph_2 as its second input and logic gate 385 has the inverted clock signal Aph_1 as its second input.

Figure 11:
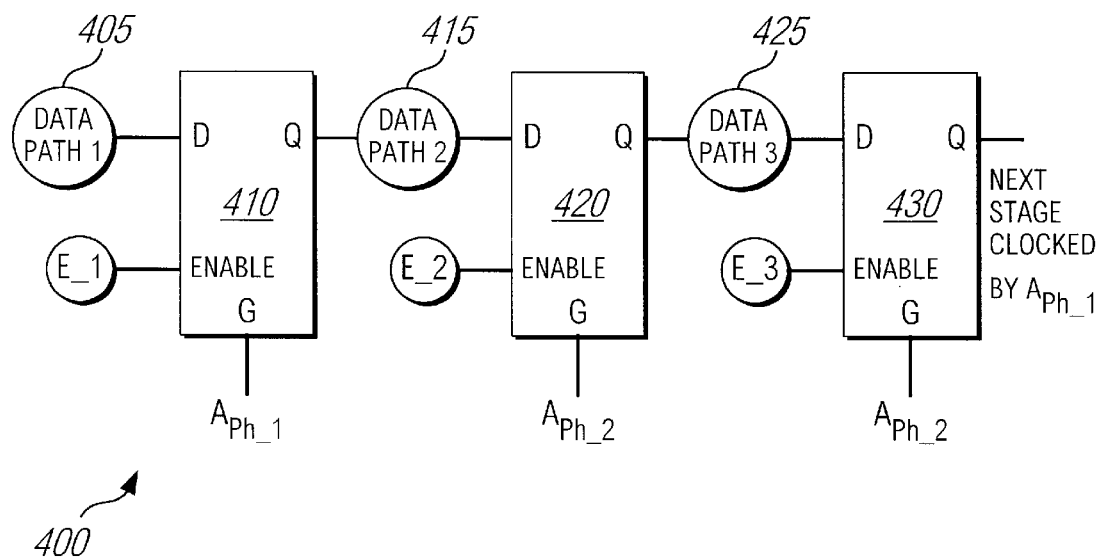
FIG. 11 is a schematic diagram of a latch-based logic circuit having consecutive latches that are clocked by the same phase of the same clock signal.

In contrast to circuit 300, latches in consecutive stages of a circuit path that are clocked by the same phase of the clock are transparent. As discussed above, when transparency exists, the basic flip-flop transformation is not possible because the emulated circuit has to account for the transparency, which is not possible with a flip-flop by itself. A circuit 400 where the latches exhibit transparency is shown in FIG. 11. The circuit 400 of FIG. 11 is comprised of latch 410, the output Q of which feeds datapath 415. The input to latch 410 comes from datapath 405. Datapath 415 feeds the input D of latch 420. The output Q of latch 420 feeds datapath 425, which feeds the input D of latch 430. The enable input of latches 410, 420 and 430 are supplied with signals E_1, E_2 and E_3, respectively. Latch 410 is clocked by clock signal Aph_1; latch 420 is clocked by clock signal Aph_2; and latch 430 is also clocked by clock signal Aph_2. Clock signals Aph_1 and Aph_2 are different phases of the same master clock signal FCLK, as seen in FIG. 5.

Figure 12:
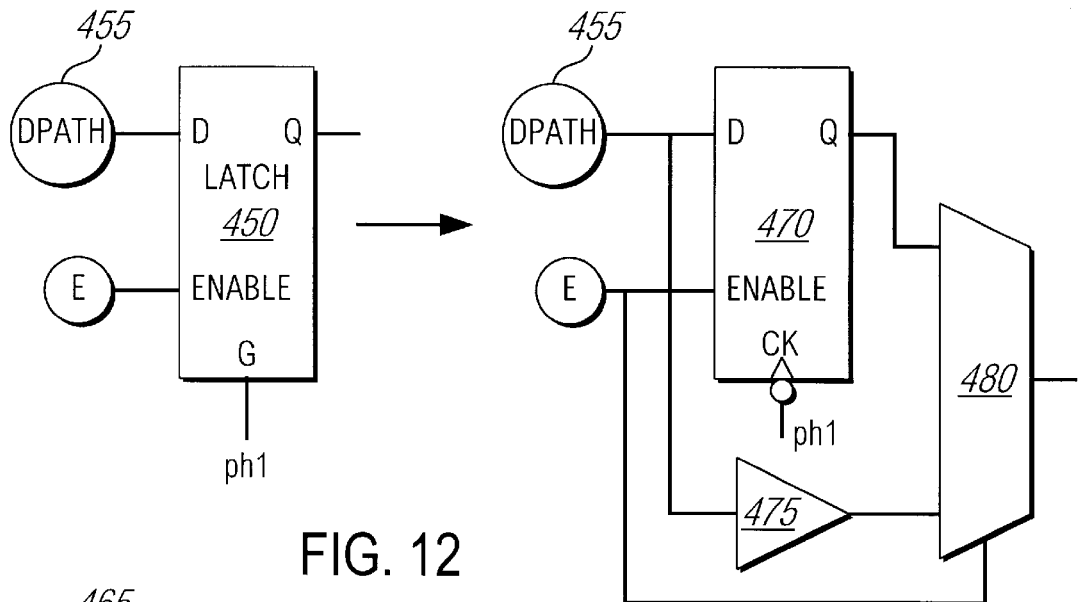
FIG. 12 is a diagram showing an additional optimization using the methods of the present invention.
Figure 13:
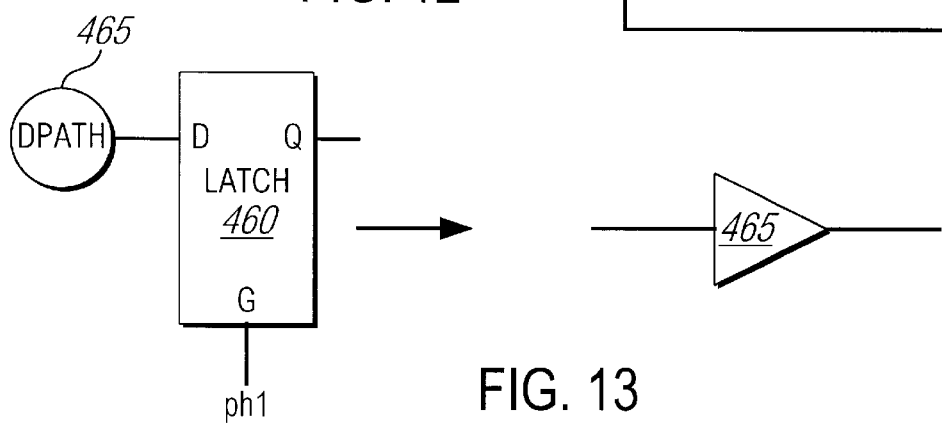
FIG. 13 is a diagram showing an additional optimization using the methods of the present invention.

Because latches 420 and 430 are clocked by the same clock signal, for example, the same phase of the same master clock signal FCLK, latches 420 and 430 are transparent with respect to each other. Therefore, latch 420 cannot be transformed into a flip-flop alone. The basic optimizations of the present invention for transparent latches are seen in FIGS. 12 and 13. The latch 450 of FIG. 12 has as its input D the output of a datapath 455. Latch 450 has a signal E input to its enable input and is clocked by signal phi. The latch 460 of FIG. 12 has as its input D the output of a datapath 465. Latch 460 does not have an enable input. In the case of the latch 460 without an enable input, the latch 460 is transformed to an unclocked buffer. The unclocked buffer allows the signal output from datapath 465 to pass right through to the next datapath, thereby maintaining transparency.

In contrast, when a latch has enable inputs, such as latch 450, the transformation creates two paths. The first path created by the transformation has a flip-flop 470 with an inverted clock input and the second path has an unclocked buffer 475. Such a transformation takes place because latch 450 can either be transparent or non-transparent, depending upon the state of the enable input. If latch 450 is a positive transparency latch and is enabled, then latch 450 is transparent. If latch 450 is a positive transparency latch and is disabled, then latch 450 is not transparent. Thus, for latches 450 that are in consecutive stages and clocked by the same clock phase signal (e.g., clock signal phi) the embodiments of the present invention will transform latch 450 as follows. The output of datapath 455 will be communicated to the input D of flip-flop 470. The output of datapath 455 will also be communicated to the input of unclocked buffer 475. The output Q of flip-flop 470 is communicated to a first data input of multiplexer 480. The output of unclocked buffer 475 is communicated to a second data input of multiplexer 480. The enable signal E is communicated to both the enable input of the flip-flop 470 and the select input of multiplexer 480. Thus, depending upon the state of the enable input, either the output Q of flip-flop 470 or the output of buffer 475 will be switched to the output of multiplexer 480. For example, if the enable signal is "high", latch 450 is transparent. In the transformed circuit, if the enable signal is "high", the enable signal that is communicated to the select input of multiplexer 480 "selects" the signal on the second data input, which is the output signal from buffer 475. Thus, the output signal from buffer 475 is placed onto the output of multiplexer 480. In contrast, if the enable signal is "low", latch 450 is not transparent. In the transformed circuit, if the enable signal is "low, the enable signal that is communicated to the select input of multiplexer 480 "selects" the signal on the first data input, which is the output Q of flip-flop 470. Thus, the output Q of flip-flop 470 is placed onto the output of multiplexer 480.

Figure 14:
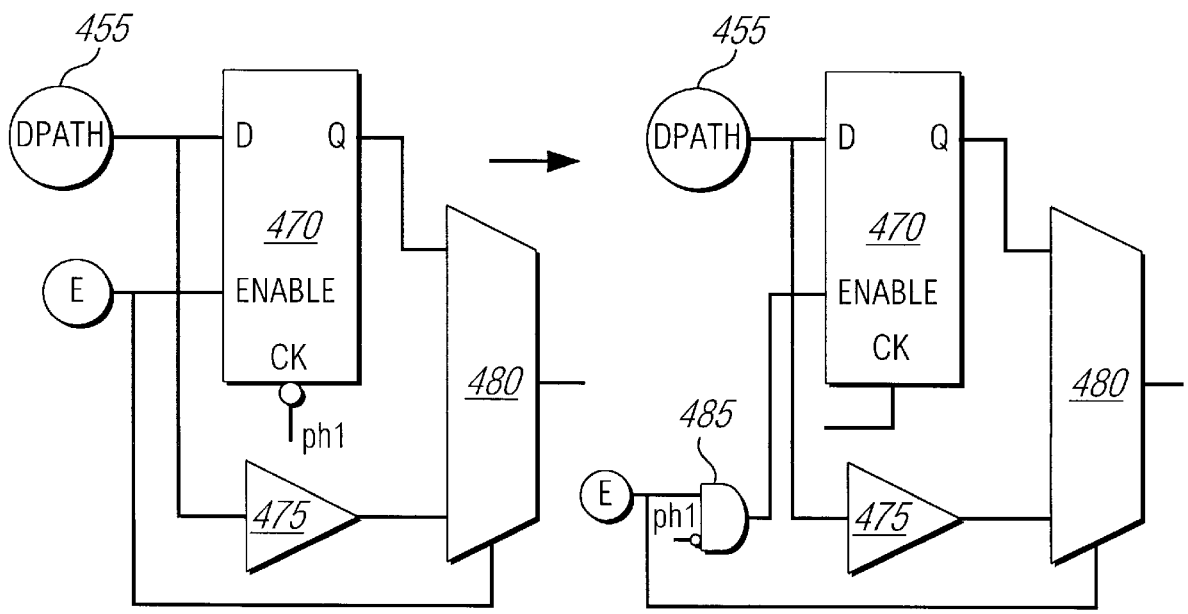
FIG. 14 is a diagram showing an additional optimization using the methods of the present invention.

After the latch 450 or the latch 460 is transformed, the transformed circuits can be transformed into a single clock system which utilizes the system's master clock, if a single clock system is desired. In the case of latch 460, which has been transformed into an unclocked buffer, no further transformation need take place. However, latch 450, which has an enable input, and which has been transformed into the flip-flop/buffer/multiplexer circuit of FIG. 12, does require a further transformation. This transformation is shown in FIG. 14. As shown in FIG. 14, the present invention adds logic gate 485 and places the output of logic gate 485 onto the enable input of the flip-flop 470. In a preferred embodiment, logic gate 485 is an AND gate. Logic gate 485 has the enable signal E that formed the enable input E to latch 450 as its first input. The second input to logic gate 485 is the inverted clock phase signal ph1. The target system's master clock FCLK is then placed on the clock input of flip-flop 470.

Figure 15:
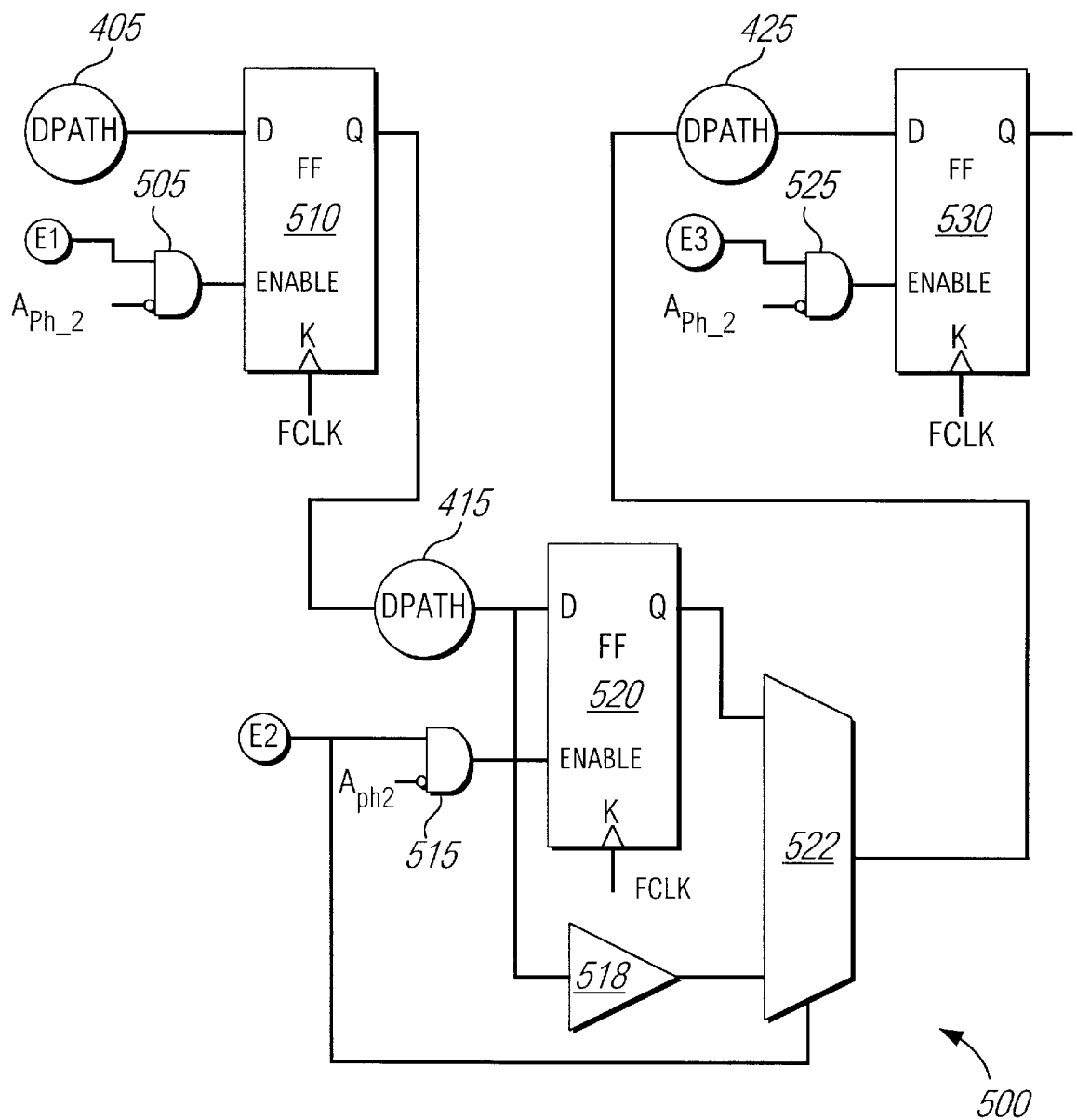
FIG. 15 is a schematic diagram of the logic circuit of FIG. 11 after being optimized using the methods of the present invention.

The optimized circuit 500 of the original latch-based design of FIG. 11 is shown in FIG. 15. As seen in FIG. 15, the present invention has transformed the latch 410 into a flip-flop 510. Datapath 405 remains the same. In addition, in the manner described above, the present invention has added logic to the enable input of the flip-flop 510 to convert the design to a single clock design. As discussed, this step is not necessary if the emulation processors used in the emulation system can handle more than one clock signal. Specifically, the present invention has added logic gate 505. In a preferred embodiment shown in FIG. 15, logic gate 510 is an AND gate. The output of logic gate 510 feeds the enable input of flip-flop 510. Logic gate 505 has as a first input the enable signal E_1 that formed the enable input to latch 410 of the unoptimized circuit 400. Logic gate 505 has a second input the inverted clock phase signal Aph_1.

Because latch 420 is the first in a series of two consecutive latches that are clocked by the same phase of the clock (Aph_2), latch 420 is transparent to latch 430 and must be transformed to the flip-flop/buffer/multiplexer circuit of FIG. 14. Thus, the output Q of flip-flop 510 feeds datapath 415, the output of which feeds both the input D of flip-flop 520 and the input of unclocked buffer 518. The output Q of flip-flop 520 is communicated to the first data input of multiplexer 522 while the output of unclocked buffer 518 is communicated to the second data input of multiplexer 522. The enable signal E_2 is a first input to logic gate 515 and the inverted clock phase Aph_2 is a second input to logic gate 515. The output of logic gate 515 is communicated to both the enable input of flip-flop 520 and the select input of multiplexer 522. Because latch 430 follows a latch which is clocked by the same phase clock but is followed by a latch is clocked by a different phase of the clock, the present invention transforms latch 430 into flip-flop 530. The reason for this, as discussed, is that latch 430 is not transparent to the latch (not shown) following it. Thus, the output of multiplexer 522 is provided to the input of datapath 425. The output of datapath 425 is communicated to the input D of flip-flop 530. In addition, in the manner described above, the present invention has added logic to the enable input of the flip-flop 530 to convert the design to a single clock design. As discussed, this step is not necessary if the emulation processors can handle more than one clock signal. Specifically, the present invention has added logic gate 525. In a preferred embodiment shown in FIG. 15, logic gate 525 is an AND gate. The output of logic gate 525 feeds the enable input of flip-flop 530. Logic gate 525 has as a first input the enable signal E_3 that formed the enable input to latch 430 of the unoptimized circuit 400. Logic gate 525 has a second input the inverted clock phase signal Aph_2.

Figure 16:
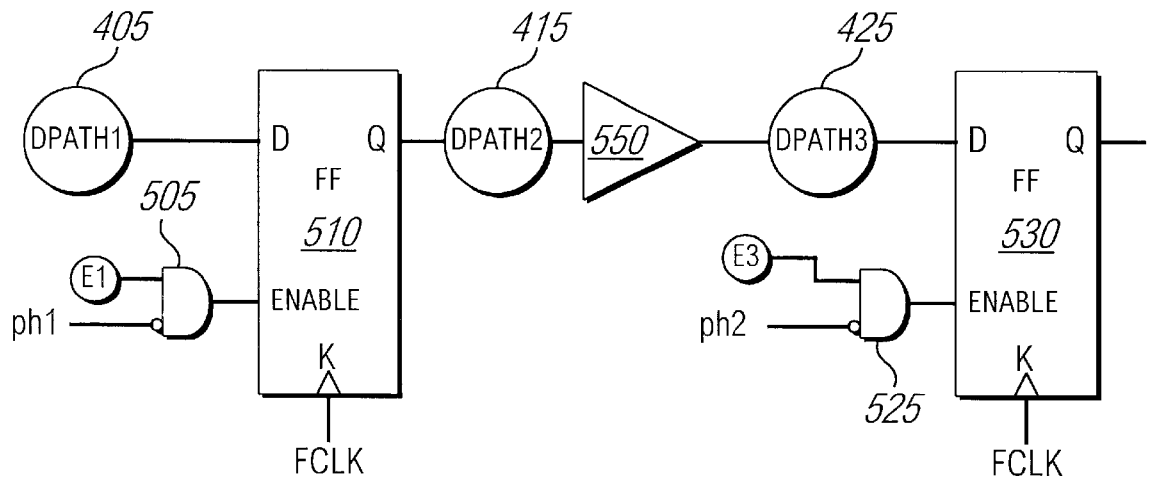
FIG. 16 is a schematic diagram of the logic circuit of FIG. 11 after being optimized using the methods of the present invention where one of the latches does not have an enable input.

If latch 420 of circuit 400 of FIG. 11 had no enable logic, the present invention would transform it in the manner shown in FIG. 16. As seen in FIG. 16, the present invention has transformed the latch 410 into a flip-flop 510. Datapath 405 remains the same. In addition, in the manner described above, the present invention has added logic to the enable input of the flip-flop 510 of FIG. 16 to convert the design to a single clock design. As discussed, this step is not necessary if the emulation processors can handle more than one clock. Specifically, the present invention has added logic gate 505. In a preferred embodiment shown in FIG. 16, logic gate 510 is an AND gate. The output of logic gate 510 feeds the enable input of flip-flop 510. Logic gate 505 has as a first input the enable signal E_1 that formed the enable input to latch 410 of the unoptimized circuit 400. Logic gate 505 has a second input the inverted clock phase signal Aph_1.

Because latch 420 is the first in a series of two consecutive latches that are clocked by the same phase of the clock (Aph_2), latch 420 is transparent to latch 430. However, because there is no clock enable logic, it is not necessary to transform latch 420 into the flip-flop/buffer/multiplexer circuit of FIG. 14. Thus, the output Q of flip-flop 510 feeds the input to datapath 415, the output of which feeds the input to unclocked buffer 550. This logic maintains transparency at all times. Because latch 430 of FIG. 11 follows a latch which is clocked by the same phase clock but is followed by a latch is clocked by a different phase of the clock, latch 430 is not transparent to the latch (not shown) which follows it. Thus, the present invention transforms latch 430 into flip-flop 530. Thus, the output of unclocked buffer 550 is provided to the input of datapath 425. The output of datapath 425 is communicated to the input D of flip-flop 530. In addition, in the manner described above, the present invention has added logic to the enable input of the flip-flop 530 to convert the design to a single clock design. As discussed, this step is not necessary if the emulation processors can handle more than one clock signal. Specifically, the present invention has added logic gate 525. In a preferred embodiment shown in FIG. 16, logic gate 525 is an AND gate. The output of logic gate 525 feeds the enable input of flip-flop 530. Logic gate 525 has as a first input the enable signal E_3 that formed the enable input to latch 430 of the unoptimized circuit 400. Logic gate 525 has a second input the inverted clock phase signal Aph_2.

Figure 17:
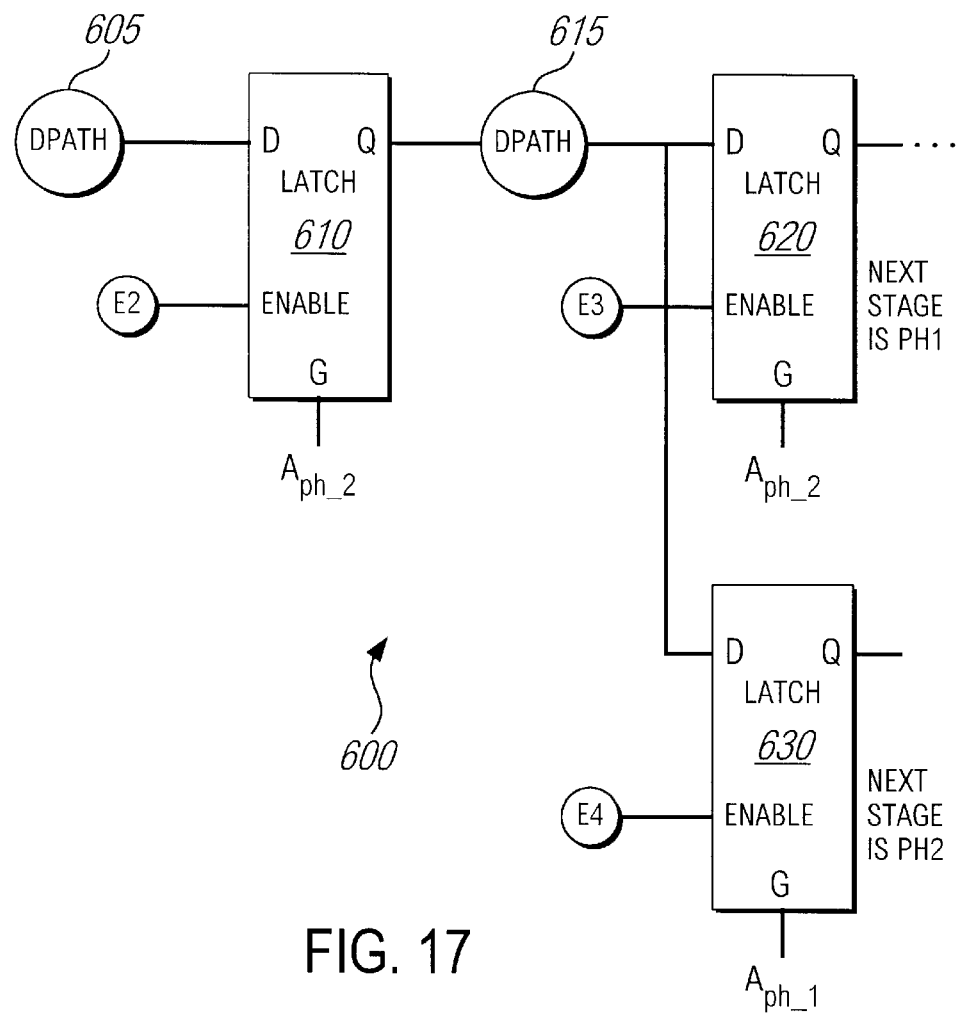
FIG. 17 is a schematic diagram of a latch-based logic circuit where consecutive latches are clocked by the same phase of the same clock signal.
Figure 18:
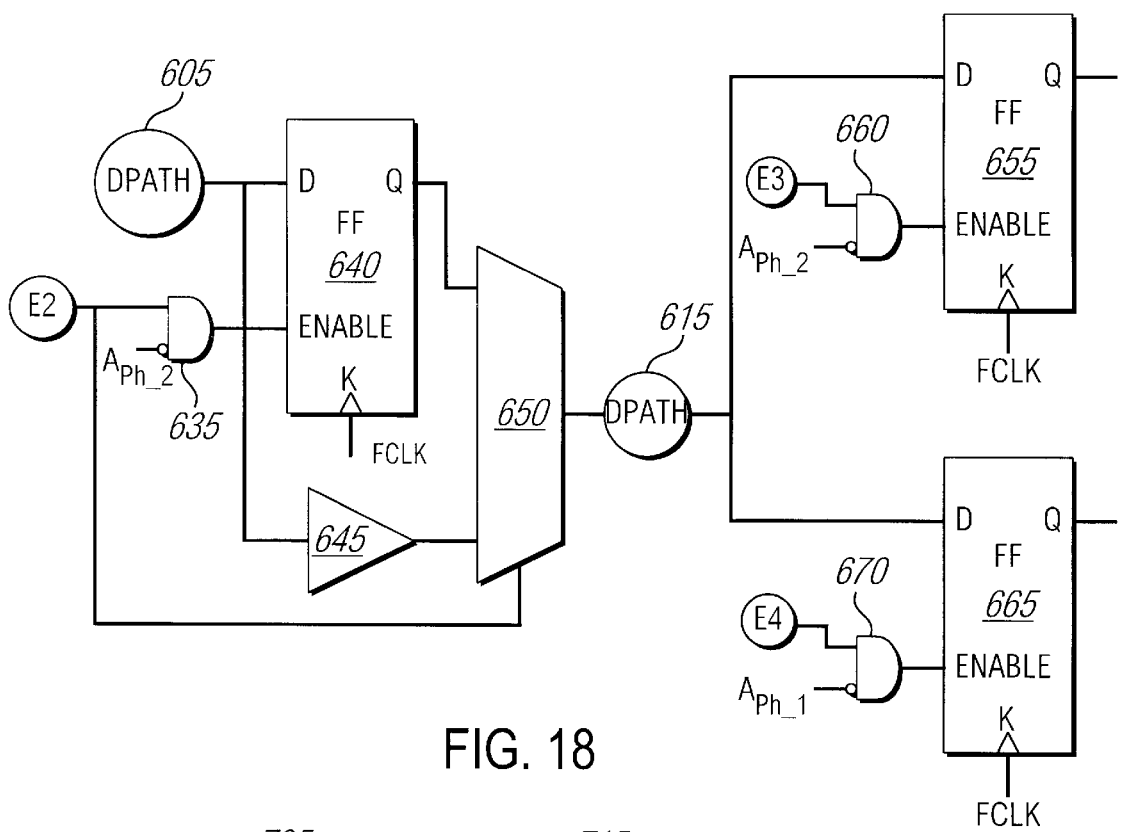
FIG. 18 is a schematic diagram of the logic circuit of FIG. 17 after being optimized using the methods of the present invention.

In yet another example of how the embodiments of the present invention optimize latch-based designs for cycle-based emulation, reference is made to FIGS. 17–18. In the circuit 600 of FIG. 17, consecutive latches are clocked by the same clock phase, thereby leading to transparency. However, the second of the consecutive latches and at least one other latch are driven by the same datapath logic, but different clock phases. Specifically, the output of datapath 605 feeds the input D of latch 610. Enable signal E_2 feeds the enable input of latch 610. The output Q of latch 610 feeds the input to datapath 615. The output of datapath 615 is communicated to both the input Q of latch 620 and the input Q of latch 630. Latches 610 and 620 are clocked by the clock signal Aph_2 while latch 630 is clocked by the clock signal Aph_1. The latch (not shown) following latch 620 is clocked by clock signal Aph_1 and the latch (not shown) following latch 630 is clocked by the clock signal Aph_2. Enable signals E_3 and E_4 feed the enable inputs of latches 620 and 630, respectively.

Because latches 610 and 620 are clocked by the same phase of the clock (in this example, Aph_2), latch 610 must be transformed into the flip-flop/buffer/multiplexer circuit of FIG. 14. The optimized version of circuit 600 is shown in FIG. 18. The output of datapath 605 feeds both the input D of flip-flop 640 and the input of unclocked buffer 645. The output Q of flip-flop 640 feeds the first data input of multiplexer 650 while the output of unclocked buffer 645 feeds the second data input of multiplexer 650. The enable signal E_2 is a first input to logic gate 635 while the inverted clock phase Aph_2 is a second input to logic gate 635. The output of logic gate 635 is communicated to both the enable input of flip-flop 640 and the select input of multiplexer 650. Because latch 620 follows a latch which is clocked by the same phase clock but is followed by a latch (not shown) that is clocked by a different phase of the clock, latch 620 is not transparent to that latch. Thus, the present invention transforms latch 620 into flip-flop 655. Thus, the output of multiplexer 650 is provided to the input of datapath 615. The output of datapath 615 is communicated to the inputs D of both flip-flops 655 and 665. In addition, in the manner described above, the present invention has added logic to the enable inputs of the flip-flops 655 and 665 in order to convert the design to a single clock design. As discussed, this step is not necessary if the emulation processors can handle more than one clock signal. Specifically, the present invention has added logic gates 660 and 670. In a preferred embodiment shown in FIG. 18, logic gates 660 and 670 are AND gates. The output of logic gate 660 feeds the enable input of flip-flop 655. Logic gate 660 has as a first input the enable signal E_3 that formed the enable input to latch 620 of the unoptimized circuit 600. Logic gate 660 has a second input the inverted clock phase signal Aph_2. The output of logic gate 670 feeds the enable input of flip-flop 665. Logic gate 670 has as a first input the enable signal E_4 that formed the enable input to latch 630 of the unoptimized circuit 600. Logic gate 670 has a second input the inverted clock phase signal Aph_1.

Figure 19:
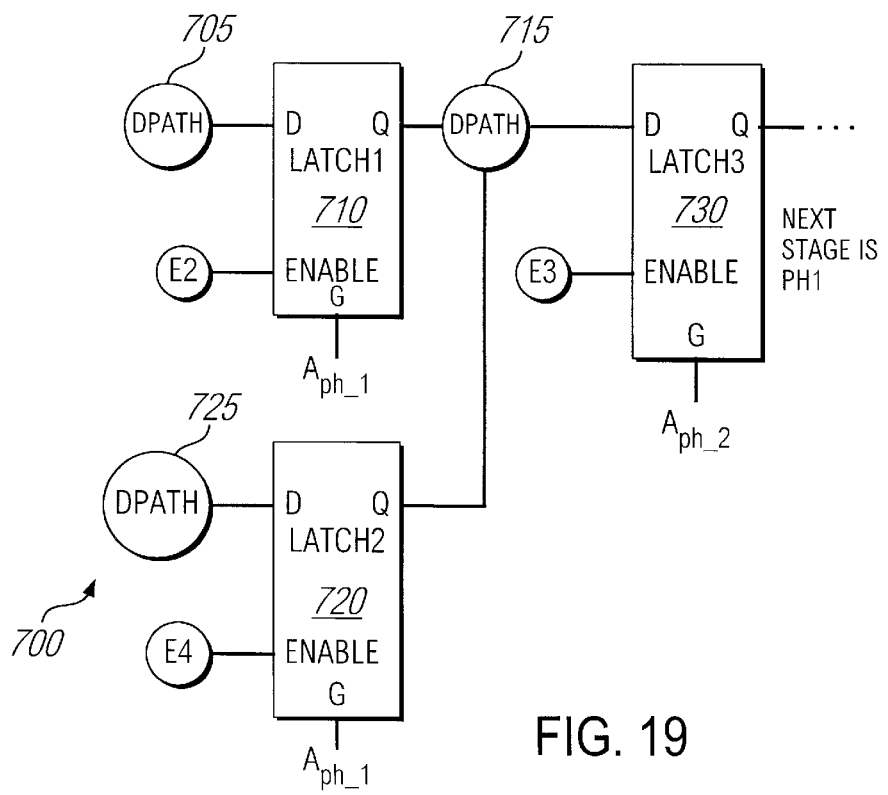
FIG. 19 is a schematic diagram of a latch-based logic circuit where consecutive latches are clocked by the same phase of the same clock signal.
Figure 20:
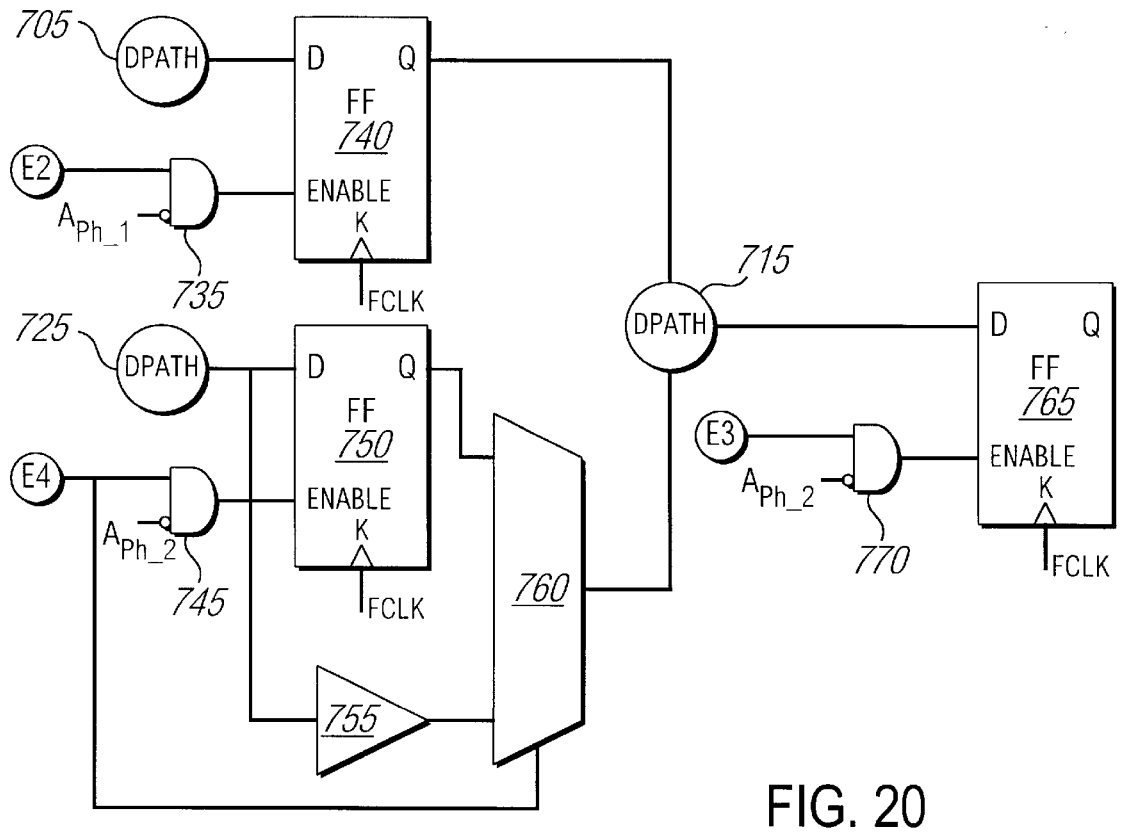
FIG. 20 is a schematic diagram of the logic circuit of FIG. 19 after being optimized using the methods of the present invention.

In yet another example of how the embodiments of the present invention optimizes latch-based designs for cycle-based emulation, reference is made to FIGS. 19–20. In the circuit 700 of FIG. 19, one of two latches that is driving the datapath feeding a third latch is clocked by the same clock phase as the third latch. Specifically, the output of datapath 705 feeds the input D of latch 710. Enable signal E_2 feeds the enable input of latch 710. Latch 710 is clocked by the clock phase signal Aph_1. The output Q of latch 710 feeds the input to datapath 715. In addition, circuit 700 also comprises datapath 725, the output of which feeds the input D of latch 720. Enable signal E_4 feeds the enable input of latch 720. Latch 720 is clocked by the clock phase signal Aph_2. Like latch 710, the output Q of latch 720 feeds the input to datapath 715.

The output of datapath 715 is communicated to the input D of latch 730. Enable signal E_3 feeds the enable input of latch 730. Latch 730 is clocked by the clock phase signal Aph_2, just as is latch 720. Thus, latches 720 and 730 are consecutive latches which are clocked by the same phase of the clock. As discussed, this leads to a transparency condition. The present invention optimizes circuit 700 for emulation using the concepts of the present invention described herein. Specifically, since latch 710 is not clocked by the same clock as a consecutive latch, it can use the transformation of FIGS. 8–9. Thus, the present invention transforms latch 710 into a flip-flop 740 whose input D is provided by the output of datapath 705. To convert circuit 700 to a single clock design, the present invention has added logic to the enable input of flip-flop 740 in the manner described above. Specifically, the present invention has added logic gate 735. In a preferred embodiment shown in FIG. 20, logic gate 735 is an AND gate. The output of logic gate 735 feeds the enable input of flip-flop 740. Logic gate 735 has as a first input the enable signal E_2 that formed the enable input to latch 710 of the unoptimized circuit 700. Logic gate 735 has a second input the inverted clock phase signal Aph_1. The output of logic gate 735 feeds the enable input of flip-flop 740.

Because latches 720 and 730 are clocked by the same phase of the clock (in this example, Aph_2), latch 720 must be transformed into the flip-flop/buffer/multiplexer circuit of FIG. 14. As shown in FIG. 20, the output of datapath 725 feeds both the input D of flip-flop 750 and the input of unclocked buffer 755. The output Q of flip-flop 750 feeds the first data input of multiplexer 760 while the output of unclocked buffer 755 feeds the second data input of multiplexer 760. To convert the design 700 to a single clock design, the enable signal E_4 is a first input to logic gate 745 while the inverted clock phase Aph_2 is a second input to logic gate 745. The output of logic gate 745 is communicated to both the enable input of flip-flop 750 and the select input of multiplexer 760.

Because latch 730 follows a latch which is clocked by the same phase clock but is followed by a latch (not shown) is clocked by a different phase of the clock, latch 730 is not transparent to the proceeding latch. Thus, the present invention transforms latch 730 into flip-flop 765. Thus, the output of multiplexer 760 is provided to the input of datapath 715. The output of datapath 715 is communicated to the input D of flip-flop 765. In addition, in the manner described above, the present invention has added logic to the enable input of flip-flop 765 to convert it to a single clock design. As discussed, this step is not necessary if the emulation processors can handle more than one clock signal. Specifically, the present invention has added logic gate 770. In a preferred embodiment shown in FIG. 20, logic gate 770 is an AND gate. The output of logic gate 770 feeds the enable input of flip-flop 765. Logic gate 765 has as a first input the enable signal E_3 that formed the enable input to latch 730 of the unoptimized circuit 700. Logic gate 770 has a second input the inverted clock phase signal Aph_2. The output of logic gate 770 feeds the enable input of flip-flop 765.

Figure 21:
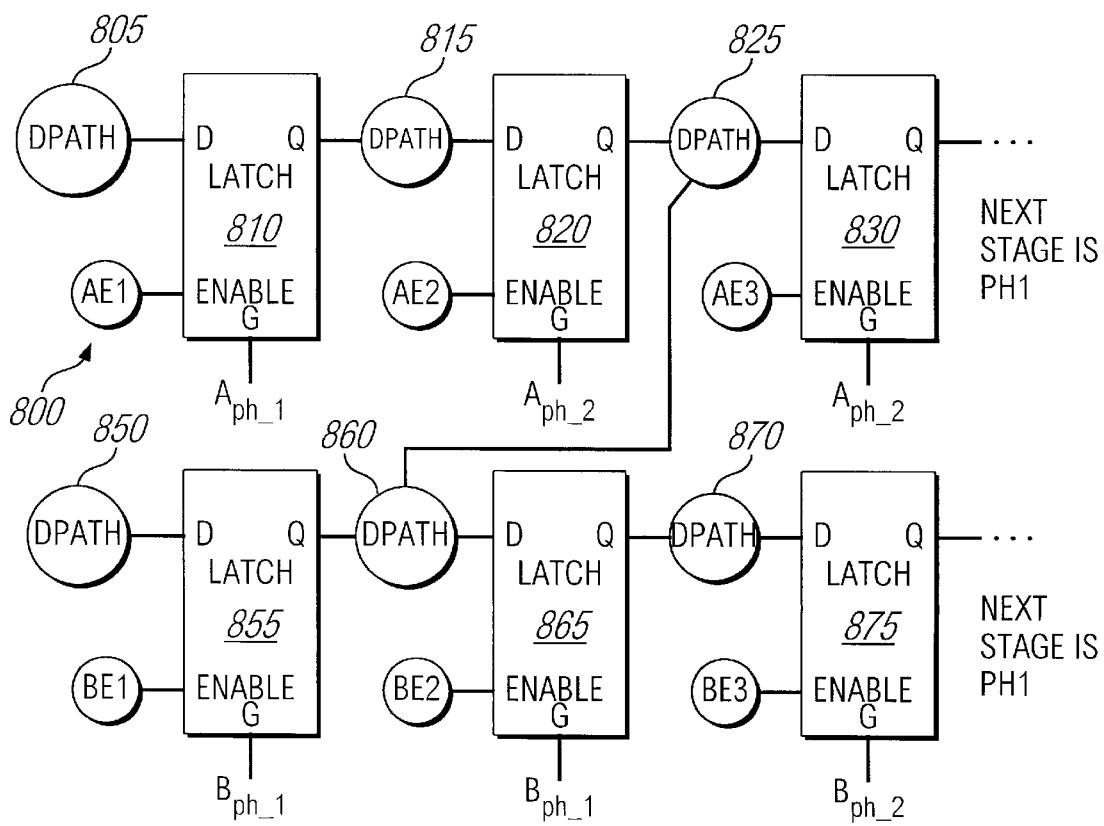
FIG. 21 is a schematic diagram of a multiple clock latch-based logic circuit where consecutive latches are clocked by the same phase of the same clock signal.
Figure 22:
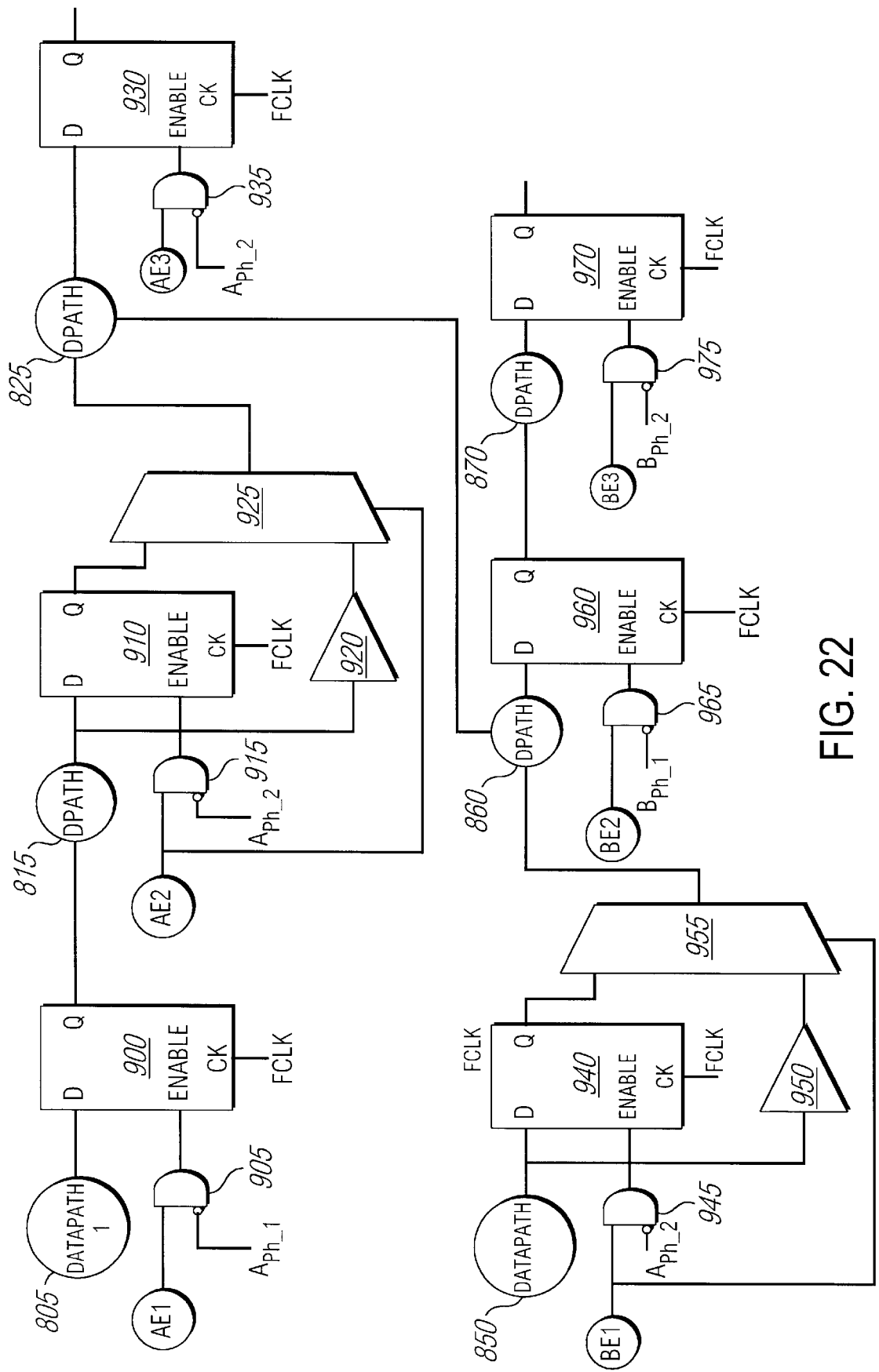
FIG. 22 is a schematic diagram of the logic circuit of FIG. 21 after being optimized using the methods of the present invention.

Another example of how a latch-based circuit design can be optimized for logic emulation is shown in FIGS. 21–22. Specifically, FIG. 21 shows a circuit 800 comprised of multiple clock signals. Specifically, the circuit of FIG. 21 has two clocks, A and B. Clocks A and B are generated by the clock generation circuit 100 shown in FIG. 5. As discussed, clock generation circuit 100 utilizes the input clock signal FCLK to generate clock signals A and B. The clock generation circuit further generates non-overlapping phases of clock A (signal Aph_1 and Aph_2) and clock B (signals Bph_1 and Bph_2).

The circuit 800 is comprised of datapath 705, the output of which is the input D to latch 810. Latch 810 is clocked by the clock signal Aph_1 and has signal AE1 as its enable input. The output Q of latch 810 is the input to datapath 815. The output of datapath 815 is the input D to latch 820. Latch 820 is clocked by the clock signal Aph_2 and has signal AE2 as its enable input. The output Q of latch 820 is the input to datapath 825. Datapath 825 has a signal path to datapath 860 and an output that is the input D to latch 830. Latch 830 is clocked by the clock signal Aph_2 and has a signal AE3 as its enable input. Thus, latches 820 and 830 are clocked by the same phase of the same clock signal. The stage of the circuit 800 that follows latch 830 is clocked by the clock signal Aph_1. Circuit 800 is also comprised of datapath 850, the output of which is the input D to latch 855. Latch 855 is clocked by the clock signal Bph_1 and has signal BE1 as its enable input. The output Q of latch 855 is the input to datapath 860. As discussed, datapath 860 has a signal path to datapath 825. The output of datapath 860 is the input D to latch 865. Latch 865 is clocked by the clock signal Bph_1 and has the signal BE2 as its enable input. Thus, latches 855 and 865 are clocked by the same phase of the same clock signal. The output Q of latch 865 is the input to datapath 870. The output of datapath 870 forms the input D to latch 875. Latch 875 is clocked by the clock signal Bph_2 and has the signal BE3 as its input signal. The stage of circuit 800 that follows latch 875 is clocked by the clock signal Bph_2.

The present invention optimizes circuit 800 for emulation as follows. Because latches 810 and 820 are clocked by a different phases of the same clock signal, the present invention will transform latch 820 into flip-flop 900. The output of datapath 805 is provided to the input D of flip-flop 900. To convert the circuit 800 to a single clock design, the present invention adds logic gate 905 to the transformed circuit in the manner described above. Specifically, the present invention provides the enable signal AE1 as a first input to logic gate 905 while the inverted clock phase Aph_1 is a second input to logic gate 905. Then, flip-flop 900 can be clocked by the system master clock FCLK. The output of logic gate 905 is communicated to the enable input of flip-flop 900. Because latches 820 and 830 are clocked by the same clock signal, in this case Aph_2, latch 820 must be transformed into the flip-flop/buffer/multiplexer circuit of FIG. 14. Thus, as shown in FIG. 22, the output of datapath 815 feeds both the input D of flip-flop 910 and the input of unclocked buffer 920. The output Q of flip-flop 910 feeds the first data input of multiplexer 925 while the output of unclocked buffer 920 feeds the second data input of multiplexer 925. To convert circuit 800 to a single clock design, the enable signal AE3 is a first input to logic gate 915 while the inverted clock phase Aph_2 is a second input to logic gate 915. The output of logic gate 915 is communicated to both the enable input of flip-flop 910 and the select input of multiplexer 925. This allows flip-flop 910 to be clocked by the master clock signal FCLK.

Because latch 830 follows a latch which is clocked by the same phase clock (latch 820) but is followed by a latch is clocked by a different phase of the clock, latch 830 is not transparent to the proceeding latch. Thus, the present invention transforms latch 830 into flip-flop 930. Thus, in the optimized circuit, the output of multiplexer 925 is provided to the input of datapath 825. The output of datapath 825 is communicated to the input D of flip-flop 930. In addition, in the manner described above, the present invention has added logic to the enable input of flip-flop 930 to convert it to a single clock design. As discussed, this step is not necessary if the emulation processors can handle more than one clock signal. Specifically, the present invention has added logic gate 935. In a preferred embodiment shown in FIG. 22, logic gate 935 is an AND gate. The output of logic gate 935 feeds the enable input of flip-flop 930. Logic gate 935 has as a first input the enable signal AE3 that formed the enable input to latch 830 of the unoptimized circuit 800. Logic gate 935 has a second input the inverted clock phase signal Aph_2. The output of logic gate 935 feeds the enable input of flip-flop 930. The addition of logic gate 935 allows flip-flop 930 to be clocked by the system master clock FCLK.

Because latch 855 is followed by a latch 865 which is clocked by the same phase of the same clock (i.e., the same clock signal), in this case Bph_1, the present invention will transform latch 855 to the flip-flop/buffer/multiplexer circuit of FIG. 14. Thus, the present invention, as shown in FIG. 22, transforms the circuit 800 as follows. The output of datapath 850 feeds both the input D of flip-flop 940 and the input of unclocked buffer 950. The output Q of flip-flop 940 feeds the first data input of multiplexer 955 while the output of unclocked buffer 950 feeds the second data input of multiplexer 955. To convert circuit 800 to a single clock design, the enable signal BE1 is a first input to logic gate 945 while the inverted clock phase Bph_1 is a second input to logic gate 945. The output of logic gate 945 is communicated to both the enable input of flip-flop 940 and the select input of multiplexer 955. This allows flip-flop 940 to be clocked by the master clock signal FCLK.

Because latch 865 follows a latch which is clocked by the same phase clock (latch 855) but is followed by latch 875, which is clocked by a different phase of the clock, latch 865 is not transparent to latch 875. Thus, the present invention transforms latch 865 into flip-flop 960. Thus, in the optimized circuit, the output of multiplexer 955 is provided to the input of datapath 860. The output of datapath 860 is communicated to the input D of flip-flop 960. In addition, in the manner described above, the present invention has added logic to the enable input of flip-flop 960 to convert it to a single clock design. As discussed, this step is not necessary if the emulation processors can handle more than one clock signal. Specifically, the present invention has added logic gate 965. In a preferred embodiment shown in FIG. 22, logic gate 965 is an AND gate. The output of logic gate 965 feeds the enable input of flip-flop 960. Logic gate 965 has as a first input the enable signal BE2 that formed the enable input to latch 865 of the unoptimized circuit 800. Logic gate 965 has a second input the inverted clock phase signal Bph_1. The output of logic gate 965 feeds the enable input of flip-flop 960. The addition of logic gate 965 allows flip-flop 960 to be clocked by the system master clock FCLK.

Because latches 875 and the latch (not shown) that immediately follows it are clocked by a different phases of the same clock signal (i.e., Bph_2 for latch 875 and Bph_1 for the latch immediately following), the present invention will transform latch 875 into flip-flop 970. The output of datapath 870 is provided to the input D of flip-flop 970. To convert the circuit 800 to a single clock design, the present invention adds logic gate 975 to the transformed circuit in the manner described above. Specifically, the present invention provides the enable signal BE3 as a first input to logic gate 975 while the inverted clock phase Bph_2 is a second input to logic gate 975. Then, flip-flop 970 can be clocked by the system master clock FCLK.

Preferred algorithm for performing the present invention are as follows:

```
// Determine which Latches need to be transparent
for (each storage element in the design) do
        record its clock and phase;
        backward search through data cones and stop at storage element or primary IOs;
        for (all the storage elements encountered in the search) do
                if (the storage element is clocked by the same clock and same phase) then
                        mark the storage element to be NEED_TO_BE_TRANSPARENT;
                endif
        endfor
endfor
//Perform the optimizations
//    1.   Substitute latches to FF, Buffer, or the FF-Buf-Mux cell
//    2.   Using the FCLK as the clock for the storage element by transform the clock
//         enable logic.
for (each storage element in the design) do
        if (the storage element is marked as NEED_TO_BE_TRANSPARENT) then
                if (there is logic at clock enable) then
                        substitute the latch with FF-Buffer-Mux cell;
                                -D pin of FF and input pin of Buffer connects to data path as D-pin
                                of the latch;
                                -EN pin of FF and Select pin of the MUX connect to the clock
                                enable logic as the EN pin of the Latch;
                                -Q pin of the FF and output pin of Buffer are the inputs to the
                                MUX;
                                -Output of MUX connects to the next stage of datapath as the Q
                                pin of the Latch;
                        substitute the clock with FCLK;
                                -disconnect the original clock at CK pin;
                                -disconnect clock enable logic at EN pin;
                                -create an AND gate;
                                -connect output of AND gate to EN pin of the FF;
                                -connect the clock enable logic to input pin to the AND-gate;
                                -connect the original clock pin to the other input pin to the AND-
                                gate (inverted if the latch was gated on falling edge of the clock);
                                -connect FCLK to the clock pin of the FF;
                else
                        substitute Latch to Buffer;
```

```
            -Input pin of Buffer connect to the datapath output as the D-pin in
            the Latch;
            -Output of the Buffer connect to the next stage datapath as the Q-
            pin in the Latch;
        endif
        else
        substitute LATCH with Flip-Flop;
            -disconnect the D, EN, CK and Q pin of the Latch;
            -connect D and Q pins of the Flip-Flop with the logic corresponding to the
            Latch;
            -connect FCLK pin to the CK pin of the FF;
            -create AND-gate;
            -connect clock enable logic to one input pin on AND-gate;
            -connect the original clock pin to the other input pin on AND-gate
            (inverted if the latch was gated on falling edge of the clock);
        endif
    endfor
```

Thus, a preferred method optimizing a latch-based circuit for logic emulation has been described. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

We claim:

1. A method for optimizing a circuit for emulation comprising:

determining whether any latches in the circuit are transparent latches and whether any of said latches are non-transparent latches;

transforming at least one of said non-transparent latches of the circuit into a first non-latch based transformed circuit; and transforming at least one of said transparent latches of the circuit into a second non-latch based transformed circuit where said second non-latch based transformed circuit comprises either a first unclocked buffer if said transparent latch does not comprise an enable input or wherein said second transformed circuit comprises a flip-flop, a second unclocked buffer, and a multiplexer if said transparent latch does comprise an enable input, said inputs to said flip-flop and said second unclocked buffer comprising the input to said transparent latch, said output of said flip-flop comprising a first data input to said multiplexer, said output of said second unclocked buffer comprising a second data input to said multiplexer, said multiplexer comprising a select input having as its input the same signal input to said enable input of said transparent latch.

2. A method for optimizing a circuit for logic emulation comprising:

determining whether any latches in the circuit are transparent latches and whether any of said latches are non-transparent latches;

transforming at least one of said non-transparent latches of the circuit into a first non-latch based transformed circuit; and transforming at least one of said transparent latches of the circuit into a second non-latch based transformed circuit wherein said transparent latch comprises an enable input, said second non-latch based transformed circuit comprising a flip-flop, an unclocked buffer, and a multiplexer, said flip-flop comprising a data input, an enable input, a clock input and an output, said unclocked buffer comprising an input and an output, said multiplexer comprising a first data input, a second data input, and a select input, said data input to said flip-flop and said input to said buffer comprising the input to said transparent latch, said output of said flip-flop comprising said first data input to said multiplexer, said output of said buffer comprising said second data input to said multiplexer, said select input of said multiplexer comprising the same signal input to said enable input of said transparent latch.

3. A method of creating an optimized circuit for emulation from a user design, the user design comprising consecutive latches, each latch of the consecutive latches comprising a data input, an output and a clock input, the consecutive latches separated by a datapath, the datapath comprising an input feeding combinational logic and an output, the output of the datapath feeding the data input to at least one of the consecutive latches, the clock input of each latch of the consecutive latches receiving one of a plurality of clock signals, the method comprising:

determining which of the consecutive latches are clocked by identical clock signals and which of the consecutive latches are clocked by different clock signals;

labeling each of the consecutive latches clocked by identical clock signals as a transparent latch;

labeling each of the consecutive latches clocked by different clock signals as a non-transparent latch;

transforming said transparent latch into a first non-latch based transformed circuit, said first non-latch based transformed circuit comprising an input corresponding to the input of said transparent latch; and transforming said non-transparent latch into a second non-latch based transformed circuit, said second non-latch based transformed circuit comprising an input corresponding to the input of said non-transparent latch.

4. The method of claim 3 wherein said first non-latch based transformed circuit comprises an unclocked buffer.

5. The method of claim 3 wherein said second non-latch based transformed circuit comprises a flip-flop, said flip-flop comprising a data input, a clock input, and an output, said clock input receiving an inverted one of the clock signal received by said transparent latch.

6. The method of claim 3 wherein each latch of the consecutive latches further comprise an enable input.

7. The method of claim 6 wherein said first non-latch based transformed circuit comprises a flip-flop, a buffer, and a multiplexer, said flip-flop comprising a data input, an enable input, a clock input and an output, said buffer comprising an input and an output, said multiplexer comprising a first data input, a second data input, and a select input, said data input to said flip-flop and said input to said buffer comprising the input to said transparent latch, said output of said flip-flop comprising said first data input to said multiplexer, said output of said buffer comprising said second data input to said multiplexer, said select input of said multiplexer comprising the same signal input to said enable input of said transparent latch, and said clock input of said flip-flip receiving an inverted one of the clock signal received by said transparent latch.

8. The method of claim 7 further comprising the step of placing an output of a logic gate onto said enable input of said flip-flop, said logic gate having as a first input the same signal input to said enable input of said transparent latch, said logic gate having said clock input of said transparent latch as a second input, said clock input being inverted.

9. The method of claim 6 wherein said second non-latch based transformed circuit comprises a flip-flop, said flip-flop comprising a data input, an enable input, a clock input and an output.

10. The method of claim 9 further comprising the step of placing an output of a logic gate onto said enable input of said flip-flop, said logic gate having as a first input the same signal input to said enable input of said non-transparent latch, said logic gate having said clock input of said non-transparent latch as a second input, said clock input being inverted.

11. A method for optimizing a circuit for logic emulation comprising:
   determining whether any latches in the circuit are transparent latches and whether any of said latches are non-transparent latches;
   transforming at least one of said non-transparent latches of the circuit into a first transformed circuit; and
   transforming at least one of said transparent latches of the circuit into a second transformed circuit, wherein said second transformed circuit comprises either a first unclocked buffer if said transparent latch does not comprise an enable input or wherein said second transformed circuit comprises a flip-flop, a second unclocked buffer, and a multiplexer if said transparent latch does comprise an enable input, said inputs to said flip-flop and said second unclocked buffer comprising the input to said transparent latch, said output of said flip-flop comprising a first data input to said multiplexer, said output of said second unclocked buffer comprising a second data input to said multiplexer, said multiplexer comprising a select input having as its input the same signal input to said enable input of said transparent latch.

12. A method for optimizing a circuit for logic emulation comprising:
   determining whether any latches in the circuit are transparent latches and whether any of said latches are non-transparent latches;
   transforming at least one of said non-transparent latches of the circuit into a first transformed circuit;
   transforming at least one of said transparent latches of the circuit into a second transformed circuit; and
   said transparent latch comprising an enable input, said second transformed circuit comprising a flip-flop, an unclocked buffer, and a multiplexer, said flip-flop comprising a data input, an enable input, a clock input and an output, said unclocked buffer comprising an input and an output, said multiplexer comprising a first data input, a second data input, and a select input, said data input to said flip-flop and said input to said buffer comprising the input to said transparent latch, said output of said flip-flop comprising said first data input to said multiplexer, said output of said buffer comprising said second data input to said multiplexer, said select input of said multiplexer comprising the same signal input to said enable input of said transparent latch.

13. A method of creating an optimized circuit for emulation from a user design, the user design comprising consecutive latches, each latch of the consecutive latches comprising a data input, an output and a clock input, the consecutive latches separated by a datapath, the datapath comprising an input feeding combinational logic and an output, the output of the datapath feeding the data input to at least one of the consecutive latches, the clock input of each latch of the consecutive latches receiving one of a plurality of clock signals, the method comprising:
   determining which of the consecutive latches are clocked by identical clock signals and which of the consecutive latches are clocked by different clock signals;
   labeling each of the consecutive latches clocked by identical clock signals as a transparent latch;
   labeling each of the consecutive latches clocked by different clock signals as a non-transparent latch;
   transforming said transparent latch into a first transformed circuit, said first transformed circuit comprising an input corresponding to the input of said transparent latch; and
   transforming said non-transparent latch into a second transformed circuit, said second transformed circuit comprising an input corresponding to the input of said non-transparent latch, said second transformed circuit further comprising a flip-flop, said flip-flop comprising a data input, a clock input, and an output, said clock input receiving an inverted one of the clock signal received by said transparent latch.

14. A method of creating an optimized circuit for emulation from a user design, the user design comprising consecutive latches, each latch of the consecutive latches comprising a data input, an output and a clock input, the consecutive latches separated by a datapath, the datapath comprising an input feeding combinational logic and an output, the output of the datapath feeding the data input to at least one of the consecutive latches, the clock input of each latch of the consecutive latches receiving one of a plurality of clock signals, the method comprising:
   determining which of the consecutive latches are clocked by identical clock signals and which of the consecutive latches are clocked by different clock signals;
   labeling each of the consecutive latches clocked by identical clock signals as a transparent latch;
   labeling each of the consecutive latches clocked by different clock signals as a non-transparent latch;
   transforming said transparent latch into a first transformed circuit, said first transformed circuit comprising an input corresponding to the input of said transparent latch;
   transforming said non-transparent latch into a second transformed circuit, said second transformed circuit comprising an input corresponding to the input of said non-transparent latch; and wherein each latch of the consecutive latches further comprise an enable input, said first transformed circuit further comprising a flip-flop, a buffer, and a multiplexer, said flip-flop comprising a data input, an enable input, a clock input and an output, said buffer comprising an input and an output, said multiplexer comprising a first data input, a second data input, and a select input, said data input to said flip-flop and said input to said buffer comprising the input to said transparent latch, said output of said flip-flop comprising said first data input to said multiplexer, said output of said buffer comprising said second data input to said multiplexer, said select input of said multiplexer comprising the same signal input to said enable input of said transparent latch, and said clock input of said flip-flip receiving an inverted one of the clock signal received by said transparent latch.

15. The method of claim 14 further comprising the step of placing an output of a logic gate onto said enable input of said flip-flop, said logic gate having as a first input the same signal input to said enable input of said transparent latch, said logic gate having said clock input of said transparent latch as a second input, said clock input being inverted.

16. A method of creating an optimized circuit for emulation from a user design, the user design comprising consecutive latches, each latch of the consecutive latches comprising a data input, an output and a clock input, the consecutive latches separated by a datapath, the datapath comprising an input feeding combinational logic and an output, the output of the datapath feeding the data input to at least one of the consecutive latches, the clock input of each latch of the consecutive latches receiving one of a plurality of clock signals, the method comprising:

determining which of the consecutive latches are clocked by identical clock signals and which of the consecutive latches are clocked by different clock signals;

labeling each of the consecutive latches clocked by identical clock signals as a transparent latch;

labeling each of the consecutive latches clocked by different clock signals as a non-transparent latch;

transforming said transparent latch into a first transformed circuit, said first transformed circuit comprising an input corresponding to the input of said transparent latch;

transforming said non-transparent latch into a second transformed circuit, said second transformed circuit comprising an input corresponding to the input of said non-transparent latch, said second transformed circuit comprising a flip-flop, said flip-flop comprising a data input, an enable input, a clock input and an output; and placing an output of a logic gate onto said enable input of said flip-flop, said logic gate having as a first input the same signal input to said enable input of said non-transparent latch, said logic gate having said clock input of said non-transparent latch as a second input, said clock input being inverted.

* * * * *